United States Patent
Chen et al.

(10) Patent No.: US 9,453,873 B2
(45) Date of Patent: Sep. 27, 2016

(54) NON-PLANAR FIELD EFFECT TRANSISTOR TEST STRUCTURE AND LATERAL DIELECTRIC BREAKDOWN TESTING METHOD

(71) Applicant: International Business Machines Corporation, Armonk, NY (US)

(72) Inventors: Fen Chen, Williston, VT (US); Roger A. Dufresne, Fairfax, VT (US); Kevin Kolvenbach, Walden, NY (US); Michael A. Shinosky, Jericho, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 320 days.

(21) Appl. No.: 14/154,505

(22) Filed: Jan. 14, 2014

(65) Prior Publication Data

US 2015/0198654 A1 Jul. 16, 2015

(51) Int. Cl.
*G01R 31/26* (2014.01)

(52) U.S. Cl.
CPC ................................ *G01R 31/2623* (2013.01)

(58) Field of Classification Search
None
See application file for complete search history.

(56) References Cited

U.S. PATENT DOCUMENTS

| 6,210,999 | B1 | 4/2001 | Gardner et al. |
| 6,410,353 | B1 | 6/2002 | Tsai |
| 6,727,501 | B1 | 4/2004 | Fan et al. |
| 7,439,538 | B2 | 10/2008 | Shi et al. |
| 8,409,882 | B2 | 4/2013 | Acar et al. |
| 8,847,401 | B2 * | 9/2014 | Chen ................... H01L 23/5222 257/249 |
| 2012/0025862 | A1 | 2/2012 | Chumakov et al. |
| 2012/0119778 | A1 | 5/2012 | Ahsan et al. |
| 2014/0092506 | A1 * | 4/2014 | Ahsan ................... H01L 27/027 361/56 |

OTHER PUBLICATIONS

Chen, et al., "New Electrical Testing Structures and Analysis Method for MOL and BEOL Process Diagnostics and TDDB Reliability Assessment," Reliability Physics Symposium (IRPS), IEEE International, Apr. 14-18, 2013, 5 pages.

* cited by examiner

*Primary Examiner* — Jermele M Hollington
*Assistant Examiner* — Douglas X Rodriguez
(74) *Attorney, Agent, or Firm* — Gibb & Riley, LLC; Anthony J. Canale

(57) ABSTRACT

Disclosed are test structures and methods for non-planar field effect transistors. The test structures comprise test device(s) on an insulator layer. Each device comprises semiconductor fin(s). Each fin has a first portion comprising a pseudo channel region at one end and a second portion comprising a diffusion region positioned laterally adjacent to the first portion. A gate with sidewall spacers can be adjacent to the first portion of the fin(s). A first contact can be on the insulator layer adjacent the end of the fin(s). A second contact can be on the second portion of the fin(s) such that the gate is positioned laterally between the contacts. Measurements taken when the first contact is biased against the gate are compared to measurements taken when the second contact is biased against the gate in order to assess lateral dielectric breakdown between the gate and first contact independent of gate dielectric breakdown.

20 Claims, 13 Drawing Sheets

NON-PLANAR FIELD EFFECT TRANSISTOR TEST STRUCTURE AND LATERAL DIELECTRIC BREAKDOWN TESTING METHOD

BACKGROUND

The present disclosure relates to the breakdown of dielectric material positioned laterally between a gate and a source/drain contact in a non-planar field effect transistor (FET) and, particularly, to a test structure for acquiring data regarding such dielectric breakdown, a method of forming the test structure, and an associated testing method.

As field effect transistor (FET) dimensions continue to be scaled and new FET configurations are developed, dielectric breakdown failure mechanisms that can significantly impact FET reliability must be considered by designers in assessing reliability. Such dielectric breakdown failure mechanisms include gate dielectric breakdown (i.e., breakdown of the gate dielectric layer between a gate conductor layer and a channel region of a FET) as well as lateral dielectric breakdown (i.e., breakdown of the dielectric material between the FET gate and an adjacent source/drain contact). With regard specifically to lateral dielectric breakdown, the scaling of FET dimensions has lead to corresponding scaling of the width of the spaces between the gate and the source/drain contacts, thereby increasing the risk of lateral dielectric breakdown. Furthermore, various different process variations (e.g., overlay variations, reactive ion etch variations, chemical mechanical polishing (CMP) variations, gate size variations, contact size variations, etc.) can result in chip-to-chip and across-chip variations in the width of the spaces between the gate and source/drain contacts in FETs manufactured according to a given FET design. Therefore, it is particularly important for designers to be able to accurately assess lateral dielectric breakdown for the given FET design and, thereby to assess its impact on FET reliability. Recently, test structures have been developed that allow lateral dielectric breakdown to be assessed in planar FETs without the influence of gate dielectric breakdown; however, such test structures are not adequate for use with non-planar FETs.

SUMMARY

In view of the foregoing, disclosed herein are test structures that allow lateral dielectric breakdown to be assessed in non-planar semiconductor structures (e.g., single-fin field effect transistors (FETs), multi-fin FETs, etc.) without the influence of gate dielectric breakdown. These test structures can comprise a test device on an insulator layer. The test device can comprise one or more semiconductor fins having a first portion comprising a pseudo channel region at one end and a second portion comprising a diffusion region positioned laterally adjacent to the first portion. A gate with sidewall spacers can be positioned on the first portion. A first contact can be positioned on the insulator layer adjacent to the end of the semiconductor fin(s) and a second contact can be positioned on the second portion of the semiconductor fin(s) such that the gate is positioned laterally between the first contact and the second contact. Optionally, the test structures can comprise duplicate test devices having the same design with different size spaces between the gate and first contact. During testing, measurement(s) of electrical properties taken from the test device when the first contact is biased against the gate can be compared to measurement(s) of electrical properties taken from the test device when the second contact is biased against the gate in order to assess lateral dielectric breakdown between the gate and the first contact independent of gate dielectric breakdown. Furthermore, such testing can be performed on any duplicate test devices, if present, in order to better predict non-planar semiconductor structure reliability.

More particularly, one disclosed test structure can be designed to predict the reliability of a non-planar semiconductor structure and, particularly, a single-fin field effect transistor (FET). This test structure can comprise a test device on an insulator layer. This test device can specifically comprise a semiconductor fin on the insulator layer. The semiconductor fin can have a first portion comprising a pseudo channel region at one end and a second portion comprising a diffusion region positioned laterally adjacent to the first portion.

The test device can further comprise a gate and sidewall spacers. The gate can be adjacent to the top surface and opposing sidewalls of the first portion of the semiconductor fin such that it is completely offset from the second portion. The sidewall spacers can be positioned laterally adjacent to the sidewalls of the gate. The test device can further comprise a first contact on the insulator layer adjacent to the end of the semiconductor fin and a second contact on the second portion. Thus, the gate can be positioned laterally between the first contact and the second contact.

Optionally, this test structure can comprise duplicate test devices having the same design with different size spaces between the gate and the first contact.

During testing, measurement(s) of electrical properties taken from the test device when the first contact is biased against the gate can be compared to measurement(s) of electrical properties taken from the test device when the second contact is biased against the gate in order to assess lateral dielectric breakdown between the gate and the first contact independent of gate dielectric breakdown. Furthermore, such testing can be performed on any duplicate test devices, if present in the test structure, in order to better predict the reliability of the single-fin FET.

Another disclosed test structure can be designed to predict the reliability of a more-complex non-planar semiconductor structure and, particularly, a multi-fin field effect transistor (FET). This test structure can comprise a test device on an insulator layer. The test device can specifically comprise multiple semiconductor fins on the insulator layer. These multiple semiconductor fins can each comprise a first portion comprising a pseudo channel region at one end and a second portion comprising a diffusion region position laterally adjacent to the first portion.

The test device can further comprise a gate and sidewall spacers. The gate can traverse the multiple semiconductor fins such that it is positioned adjacent to the top surface and opposing sidewalls of the first portion within each of the semiconductor fins and such that it is completely offset from the second portion within those semiconductor fins. The sidewall spacers can be positioned laterally adjacent to the sidewalls of the gate. The test device can further comprise a first contact on the insulator layer adjacent to the end of each of the multiple semiconductor fins and a second contact traversing the multiple semiconductor fins such that it is adjacent to and, particularly, on the second portion of each of the multiple semiconductor fins. Thus, the gate can be positioned laterally between the first contact and the second contact.

Optionally, this test structure can comprise duplicate test devices having the same design with different sizes spaces between the gate and the first contact.

During testing, measurement(s) of electrical properties taken from the test device when the first contact is biased against the gate can be compared to measurement(s) of electrical properties taken from the test device when the second is biased against the gate in order to assess lateral dielectric breakdown between the gate and the first contact independent of gate dielectric breakdown. Furthermore, such testing can be performed on any duplicate test devices, if present in the test structure, in order to better predict the reliability of the multi-fin FET.

Yet another disclosed test structure can be designed to predict the reliability of an even more complex non-planar semiconductor structure and, particularly, an electrical component comprising a plurality of multi-fin FETs that share a gate. This test structure can comprise a test device on an insulator layer. The test device can specifically comprise multiple semiconductor fins on the insulator layer. The multiple semiconductor fins can comprise at least one first semiconductor fin and at least one second semiconductor fin. Each of the multiple semiconductor fins can have a first portion at one end and a second portion positioned laterally adjacent to the first portion. In the first semiconductor fin(s), the first portion can comprise a first pseudo channel region and the second portion can comprise a first diffusion region having a first conductivity type. In the second semiconductor fin(s), the first portion can comprise a second pseudo channel region and the second portion can comprise a second diffusion region having a second type conductivity different from the first type conductivity.

The test device can further comprise a gate and sidewall spacers. The gate can traverse the multiple semiconductor fins such that it is adjacent to the top surface and opposing sides of the first portion in each of the multiple semiconductor fins and such that it is completely offset from the second portion within those semiconductor fins. The sidewall spacers can be positioned laterally adjacent to the sidewalls of the gate. The test device can further comprise a plurality of contacts. These contacts can comprise, for example, first contacts on the insulator layer adjacent to the end of first semiconductor fin(s) and second semiconductor fin(s), respectively, and second contacts traversing the first semiconductor fin(s) and the second semiconductor fin(s), respectively, such that they are adjacent to and, particularly, on the second portion of each of the first semiconductor fin(s) and second semiconductor fin(s), respectively. Thus, the gate can be positioned laterally between the first contacts and the second contacts.

Optionally, this test structure can comprise duplicate test devices having the same design with different size spaces between the gate and the first contacts.

During testing, measurement(s) of electrical properties taken from the test device when the first insulator layer contact and the second insulator layer contact are biased against the gate can be compared to measurement(s) of electrical properties taken from the test device when the first diffusion region contact and the second diffusion region contact are biased against the gate in order to assess lateral dielectric breakdown between the gate and the insulator layer contacts independent of gate dielectric breakdown. Furthermore, such testing can be performed on any duplicate test devices, if present in the test structure, in order to better predict the reliability of electrical component.

Also disclosed herein are embodiments of a testing method. The method can comprise providing any of the test structures, as described in detail above, comprising a test device designed to predict the reliability of a particular non-planar semiconductor structure, such as a single-fin field effect transistor (FET), a multi-fin FET or an even more-complex non-planar structure (e.g., an electrical component comprising a plurality of multi-fin FETs that share a gate). Optionally, the provided test structure can comprise duplicate test devices, which have the same design as the test device except that at least some of the duplicate test devices have different size spaces between the gate and first contact(s).

The method can further comprise testing the test device. Specifically, to test a test device, which was designed to predict the reliability of a particular non-planar semiconductor structure (e.g., a single-fin field effect transistor (FET) or a multi-fin FET), the first contact(s) can be independently biased against the gate and, while it/they are being independently biased against the gate, at least one first electrical property measurement can be acquired from the test device. Additionally (e.g., either before or after independently biasing the insulator layer contact against the gate), the second contact(s) can be independently biased against the gate and, while the second contact(s) is/are independently biased against the gate, at least one second electrical property measurement, which corresponds to the first electrical property measurement, can be acquired from the test device. Then, the first electrical property measurement(s) can be compared to the corresponding second electrical property measurement(s) in order to assess lateral dielectric breakdown between the gate and the first contact(s) independent of gate dielectric breakdown. In the case where duplicate test devices are present on the test structure, the method can further comprise repeating the testing process for each of the duplicate test devices and then compiling the results to predict the reliability of the particular non-planar semiconductor structure at issue.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1A:
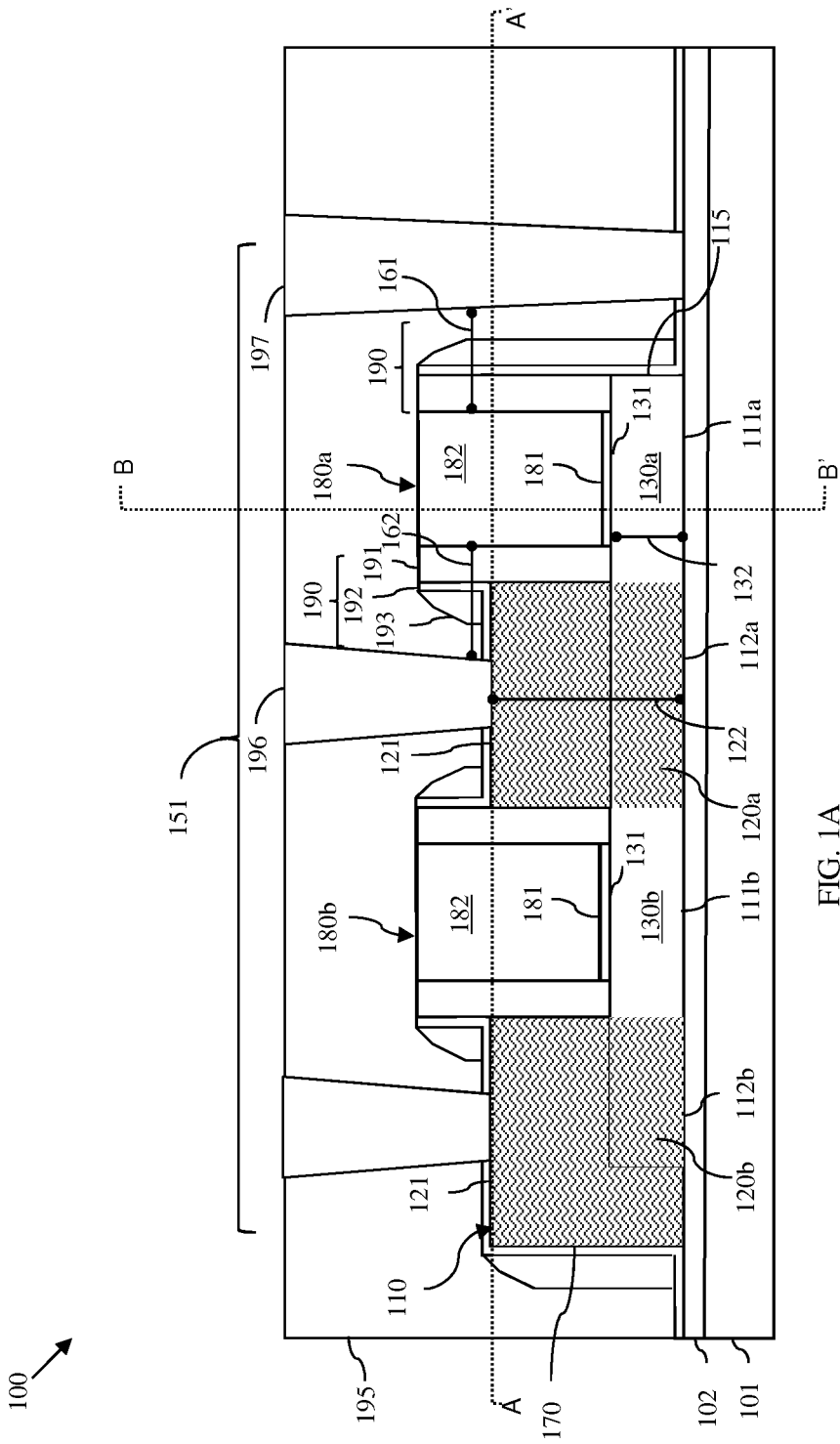
FIG. 1A is a cross-section diagram of a test structure for a single-fin field effect transistor (FET) along a vertical plane.

As mentioned above, as field effect transistor (FET) dimensions continue to be scaled and new FET configurations are developed, dielectric breakdown failure mechanisms that can significantly impact FET reliability must be considered by designers in assessing reliability. Such dielectric breakdown failure mechanisms include gate dielectric breakdown (i.e., breakdown of the gate dielectric layer between a gate conductor layer and a channel region of a FET) as well as lateral dielectric breakdown (i.e., breakdown of the dielectric material between the FET gate and an adjacent source/drain contact). With regard specifically to lateral dielectric breakdown, the scaling of FET dimensions has lead to corresponding scaling of the width of the spaces between the gate and the source/drain contacts, thereby increasing the risk of lateral dielectric breakdown. Furthermore, various different process variations (e.g., overlay variations, reactive ion etch variations, chemical mechanical polishing (CMP) variations, gate size variations, contact size variations, etc.) can result in chip-to-chip and across-chip variations in the width of the spaces between the gate and source/drain contacts in FETs manufactured according to a given FET design. Therefore, it is particularly important for designers to be able to accurately assess lateral dielectric breakdown for the given FET design and, thereby to assess its impact on FET reliability. Recently, test structures have been developed that allow lateral dielectric breakdown to be assessed in planar FETs without the influence of gate dielectric breakdown; however, such test structures are not adequate for use with non-planar FETs.

In view of the foregoing, disclosed herein are test structures that allow lateral dielectric breakdown to be assessed in non-planar semiconductor structures (e.g., single-fin field effect transistors (FETs), multi-fin FETs, etc.) without the influence of gate dielectric breakdown. These test structures can comprise a test device on an insulator layer. The test device can comprise one or more semiconductor fins having a first portion comprising a pseudo channel region at one end and a second portion comprising a diffusion region positioned laterally adjacent to the first portion. A gate with sidewall spacers can be positioned on the first portion. A first contact can be positioned on the insulator layer adjacent to the end of the semiconductor fin(s) and a second contact can be positioned on the second portion of the semiconductor fin(s) such that the gate is positioned laterally between the first contact and the second contact. Optionally, the test structures can comprise duplicate test devices having the same design with different size spaces between the gate and first contact. During testing, measurement(s) of electrical properties taken from the test device when the first contact is biased against the gate can be compared to measurement(s) of electrical properties taken from the test device when the second contact is biased against the gate in order to assess lateral dielectric breakdown between the gate and the first contact independent of gate dielectric breakdown. Furthermore, such testing can be performed on any duplicate test devices, if present, in order to better predict non-planar semiconductor structure reliability.

Figure 1B:
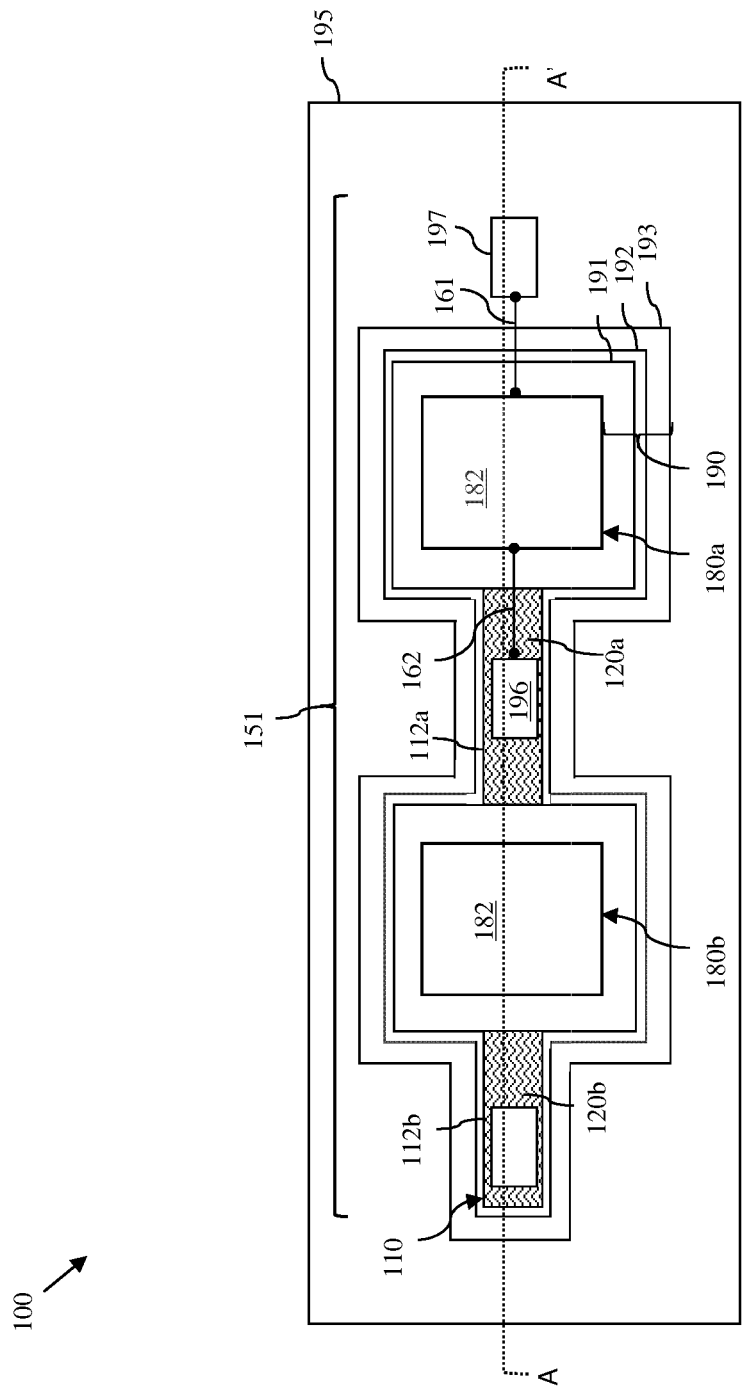
FIG. 1B is another cross-section diagram of the test structure of FIG. 1A along a horizontal plane A-A', as identified in FIG. 1A.
Figure 1C:
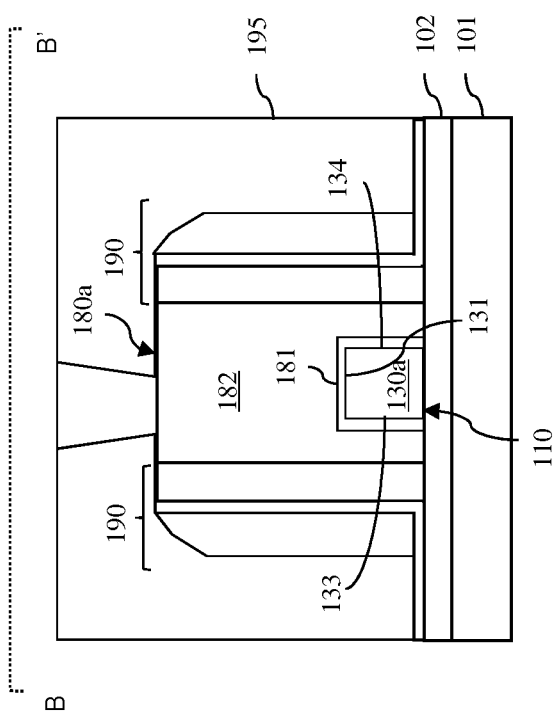
FIG. 1C is yet another cross-section diagram of the test structure of FIG. 1A along another vertical plane B-B', as identified in the FIG. 1A.

More particularly, FIGS. 1A-1C illustrate different cross-section views of a test structure 100 comprising at least one test device 151 for a single-fin field effect transistor (FET). Specifically, FIG. 1A is a cross-section diagram of a test structure 100 along a vertical plane extending across the length of a semiconductor fin 110 incorporated into the test device 151. FIG. 1B is another cross-section diagram of the test structure 100 along a horizontal plane A-A', as identified in FIG. 1A. FIG. 1C is yet another cross-section diagram of the test structure 100 along another vertical plane B-B', as identified in the FIG. 1A.

Figure 2A:
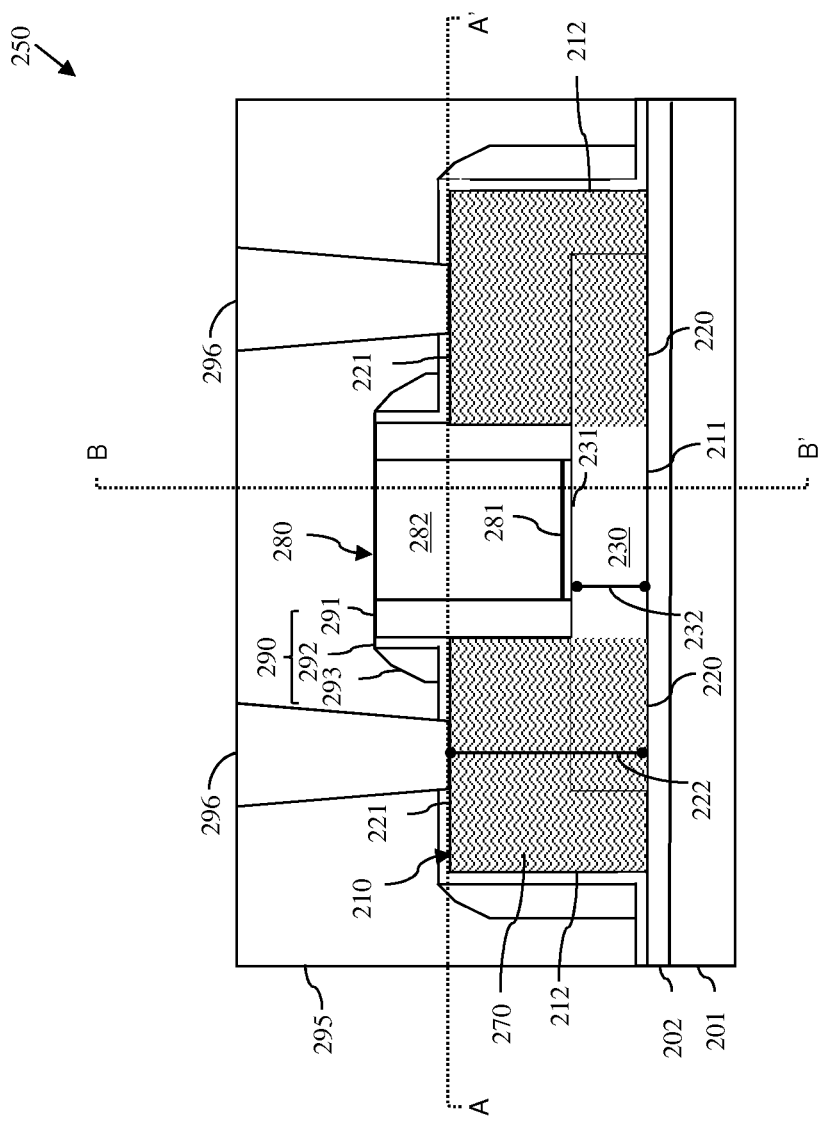
FIG. 2A is a cross-section diagram of an exemplary single-fin FET along a vertical plane.
Figure 2B:
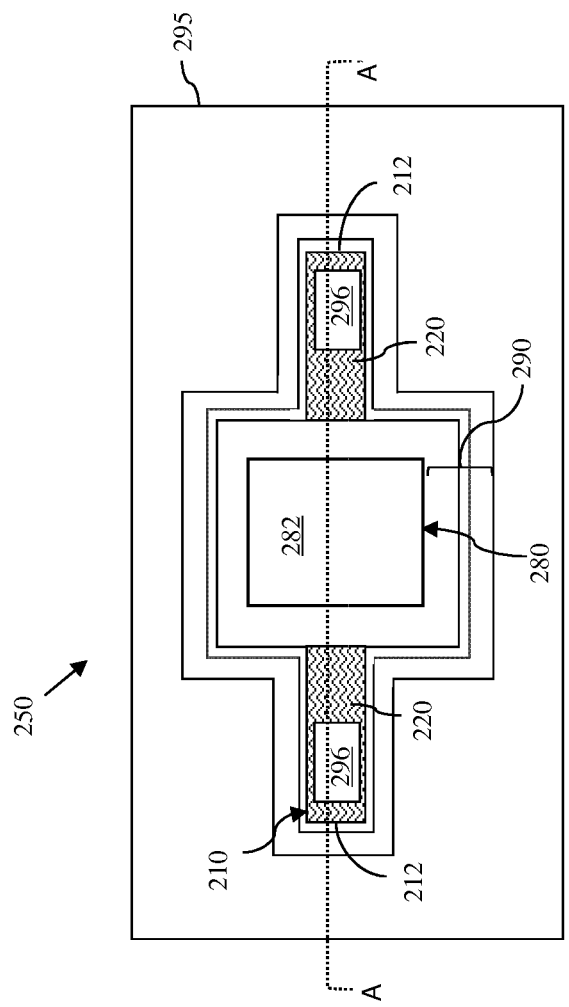
FIG. 2B is another cross-section diagram of the single-fin FET of FIG. 2A along a horizontal plane A-A', as identified in FIG. 2A.
Figure 2C:
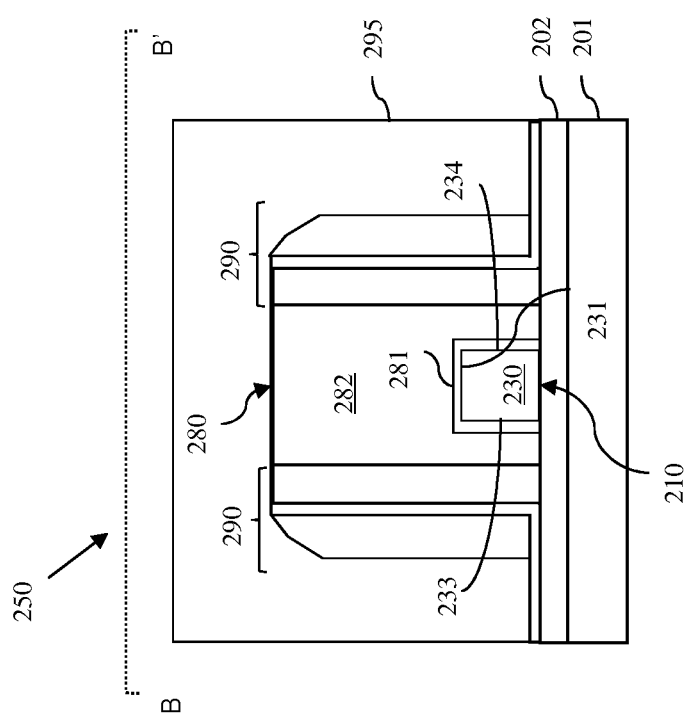
FIG. 2C is yet another cross-section diagram of the single-fin FET of FIG. 2A along another vertical plane B-B', as identified in the FIG. 2A.

FIGS. 2A-2C are different cross-section views of an exemplary single-fin FET 250 for which the test device 151 could be designed. Specifically, FIG. 2A is a cross-section diagram of the single-fin FET 250 along a vertical plane extending across the length of a semiconductor fin 210 incorporated into the single-fin FET 250. FIG. 2B is another cross-section diagram of the single-fin FET 250 along a horizontal plane A-A', as identified in FIG. 2A. FIG. 2C is yet another cross-section diagram of the single-fin FET 250 along another vertical plane B-B', as identified in the FIG. 2A.

Referring to FIGS. 2A-2C in combination, this single-fin FET 250 can comprise a semiconductor substrate 201 (e.g., a silicon substrate or any other suitable semiconductor substrate) and an insulator layer 202 (e.g., a silicon dioxide layer or any other suitable insulator layer) on the semiconductor substrate 201. The single-fin FET 250 can further comprise a semiconductor fin 210 (e.g., a silicon fin, a silicon germanium fin, a hybrid semiconductor fin having end portions comprising a first semiconductor material and a center portion comprising a second semiconductor material or any other suitable semiconductor fin) on the insulator layer 202. The semiconductor fin 210 can have a first portion 211 and second portions 212. The first portion 211 can be positioned laterally between the second portions 212. Optionally, the second portions 212 can comprise an additional semiconductor layer 270 (e.g., an epitaxial semiconductor layer, such as an epitaxial silicon layer, epitaxial silicon germanium layer, etc.) such that the first portion 211 has a first height 232 as measured from the insulator layer 202 to the top surface 231 of the first portion 211 and such that the second portions 212 have a second height 222 that is greater than the first height 232 as measured from the insulator layer 202 to the top surface 221 of the second portions 212. Additionally, the first portion 211 can have a first width and the second portion 212 can have a second width that is greater than the first width (not shown).

The second portions 212 of the semiconductor fin 210 can comprise source/drain diffusion regions 220 (i.e., regions implanted with source/drain dopants) and the first portion 211 of the semiconductor fin 210 can comprise a channel region 230 positioned laterally between the source/drain diffusion regions 220. If the second portions 212 comprise the additional semiconductor layer 270, these source/drain diffusion regions 220 will be considered raised source/drain diffusion regions. The channel region 230 and source/drain diffusion regions 220 can have different doping profiles. Optionally, the semiconductor fin 210 can further comprise one or more additional doped regions (not shown) including but not limited to source/drain extension region(s) and halo region(s) positioned between any one or both of the source/drain regions 220 and the channel region 230. Such additional doped regions are well known in the art and, thus, the details are omitted from this specification in order to allow the readers to focus on the salient aspects of the disclosed method. Those skilled in the art will recognize that the doping profiles (i.e., the conductivity types and/or conductivity levels) of the channel region 230, source/drain diffusion regions 220, and any additional doped regions within the semiconductor fin 210 will vary depending upon the conductivity type of the FET 250, the desired conductivity levels of the components, the desired performance, etc.

This single-fin FET 250 can further comprise a gate 280 positioned adjacent to the channel region 230 on the top surface 231 and opposing sidewalls 233-234. The gate 280 can comprise one or more gate dielectric layers 281 (e.g., a silicon dioxide layer, a silicon nitride layer, a silicon oxynitride layer, a high-k dielectric layer, etc.) and one or more gate conductor layers 282 (e.g., doped polysilicon layer(s), metal layer(s), metal alloy layer(s), etc.) on the gate dielectric layer(s) 281. Various different gate structures for non-planar field effect transistors are well known in the art. Thus, the details of such gate structures are omitted from this specification in order to allow the reader to focus on the salient aspects of the disclosed test structures. In any case, in such a non-planar FET structure, the channel region 230 can exhibit three-dimensional field effects. However, optionally, the top surface 231 of the channel region 230 can be electrically isolated from the gate 280 by a dielectric cap layer (not shown) (e.g., a silicon nitride cap layer) so that only two-dimensional field effects are exhibited.

Sidewall spacers 290 comprising one or more layers of dielectric spacer material (e.g., silicon dioxide, silicon nitride, silicon oxynitride, etc.) can be positioned laterally adjacent to the sidewalls of the gate 280. For example, a first dielectric spacer layer 291 (e.g., a silicon dioxide spacer layer) can be positioned laterally around and immediately adjacent to the sidewalls of the gate 280 so as to electrically isolate the epitaxial semiconductor layer 270 of the raised source/drain diffusion regions 220 (if applicable) from the gate 280. One or more additional dielectric spacer layers 292-293 (e.g., a silicon nitride spacer layer and another silicon dioxide spacer layer) can be positioned laterally adjacent to the first dielectric spacer layer 291.

Additionally, one or more additional dielectric layers 295 (i.e., interlayer dielectrics) can blanket the single-fin FET 250. These additional dielectric layer(s) can comprise, for example, one or more layers of any of the following dielectric materials: silicon dioxide, silicon nitride, silicon oxynitride, borophosphosilicate glass (BPSG), etc.

Contacts 296 can extend vertically through the additional dielectric layers 295 to the top surface 221 of the source/drain diffusion regions 220 in the second portions 212 such that the gate 280, which is adjacent to the channel region 230 in the first portion 211, is positioned laterally between the contacts 296.

A single-fin FET 250, such as that described above, can exhibit dielectric breakdown failure mechanisms including gate dielectric breakdown (i.e., breakdown of the gate dielectric layer(s) 281 between the gate conductor layer(s) 282 and the channel region 230) as well as lateral dielectric breakdown (i.e., breakdown of the dielectric material, including the dielectric material of the sidewall spacers 290 and, if applicable, of the interlayer dielectrics 295) between the gate 280 and each of the contacts 296.

As mentioned above, FIGS. 1A-1C illustrate different cross-section views of a test structure 100 comprising at least one test device 151 for a single-fin FET, such as that described above and illustrated in FIGS. 2A-2C. Specifically, the test device(s) 151 of the test structure 100 allow lateral dielectric breakdown in the single-fin FET 250 to be assessed without the influence of gate dielectric breakdown and, thereby allow the performance and reliability of single-fin FET 250 to be better predicted. More particularly, referring to FIGS. 1A-1C in combination with FIGS. 2A-2C, the test structure 100 can comprise a semiconductor substrate 101 (e.g., a silicon substrate or any other suitable semiconductor substrate) and an insulator layer 102 (e.g., a silicon dioxide layer or any other suitable insulator layer) on the semiconductor substrate 101. The test structure 100 can further comprise at least one test device 151 for a single-fin FET on the insulator layer 102.

This test device 151 can correspond to the single-fin FET 250, but can be modified so as to allow lateral dielectric breakdown to be assessed without the influence of gate dielectric breakdown. Specifically, the test device 151 can comprise a semiconductor fin 110 on the insulator layer 102. This semiconductor fin 110 can comprise the same semiconductor material, dimensions, etc. as specified in the design for the single-fin FET 250. Thus, for example, the semiconductor fin 110 can comprise a silicon fin, a silicon germanium fin, etc.

The semiconductor fin 110 can have a first portion 111$a$ at one end 115 and a second portion 112$a$ positioned laterally adjacent to the first portion 111$a$.

Optionally, the semiconductor fin 110 can further have alternating additional first and second portions (e.g., an additional first portion 111$b$ positioned laterally adjacent to the second portion 112$a$ and an additional second portion 112$b$ positioned laterally adjacent to the additional first portion 111$b$). Also, optionally, the second portion(s) 112$a$-$b$ of the semiconductor fin 110 can comprise an additional semiconductor layer 170 (e.g., an epitaxial semiconductor layer, such as an epitaxial silicon layer, epitaxial silicon germanium layer, etc.) such that the first portion(s) 111$a$-$b$ have a first height 132 as measured from the insulator layer 102 to the top surface 131 of the first portion(s) 111$a$-$b$ and such that the second portion(s) 112$a$-$b$ have a second height 122 that is greater than the first height 132 as measured from the insulator layer 102 to the top surface 131 of the first portions 111$a$-$b$. Additionally, the first portion(s) 111$a$-$b$ can have a first width and the second portion(s) 112$a$-$b$ can have a second width that is greater than the first width (not shown).

In the test device 151, the first portion 111$a$ at the end 115 of the semiconductor fin 110 can comprise a pseudo channel region 130$a$ and the second portion 112$a$ can comprise a diffusion region 120$a$ positioned laterally adjacent to the pseudo channel region 130$a$. The pseudo channel region 130$a$ and diffusion region 120$a$ can have different doping profiles. More specifically, within the semiconductor fin 110, a pseudo channel region 130$a$ can be positioned in the first portion 111$a$ immediately adjacent the end 115. The pseudo channel region 130$a$ can have essentially the same doping profile as specified for the channel region 230 in the design of the single-fin FET 250. The term "pseudo channel region" refers to that fact that this region 130$a$ is positioned laterally adjacent to only a single diffusion region 120$a$ rather than being positioned laterally between two source/drain diffusion regions, as is typically the case for a channel region of a FET (e.g., see channel region 230). Similarly, the diffusion region 120$a$ can have essentially the same doping profile as specified for a source/drain diffusion region 220 in the design for the single-fin FET 250. If present, any additional first portion(s) 111$b$ can comprise additional channel regions 130$b$ and any additional second portion(s) 112$b$ can comprise additional diffusion region(s) 120b having the same doping profiles as the pseudo channel region 130a and diffusion region 120a, respectively. Furthermore, if the second portion(s) 112a-b comprise the additional semiconductor layer 170, the diffusion region 120a and any additional diffusion regions 120b will be considered raised diffusion regions. It should be understood that in the test device 151 the semiconductor fin 110 may further comprise one or more additional doped regions (not shown) positioned between the diffusion region 120a and the pseudo channel region 130a (e.g., an extension region and/or a halo region) and/or between any additional diffusion region(s) 120b and additional channel region(s) 130b. Such additional doped regions can correspond to similar additional doped regions in the design of the single-fin FET 250.

The test device 151 can further comprise a gate 180a. Generally, the gate 180a can have essentially the same structure (i.e., can comprise the same materials, etc.) as specified for the gate 280 in the design for the single-fin FET 250. For example, the gate 180a can comprise one or more gate dielectric layers 181 (e.g., a silicon dioxide layer, a silicon nitride layer, a silicon oxynitride layer, a high-k dielectric layer, etc.) and one or more gate conductor layers 182 (e.g., doped polysilicon layer(s), metal layer(s), metal alloy layer(s) etc.) on the gate dielectric layer(s) 181. Optionally, however, the gate dielectric layer(s) 181 may be relatively thick as compared to the gate dielectric layer(s) 281 as specified in the design for the single-fin FET 250. The thicker gate dielectric layer(s) 181 can be incorporated into test device 151 in order to limit any gate dielectric breakdown.

Although many of the features of the test device 151 are similar to the single-fin FET 250, placement of the gate 180a in the test device 151 is, by design, different than placement of the gate 280 in the single-fin FET 250. Specifically, as discussed above, in the single-fin FET 250, the gate 280 is positioned adjacent to the top surface 231 and opposing sides 233-234 of a channel region 230, which is positioned laterally between two source/drain diffusion regions 220. Contrarily, in the test device 151, the gate 180a is position on the top surface 131 and opposing sides 133-134 of a pseudo channel region 130a, which is positioned at the end of the semiconductor fin 110 such that it is only adjacent to a single diffusion region 120a. Those skilled in the art will recognize that alignment of the gate on the first portion 111a at the end 115 can be achieved, during processing, through precise lithographic patterning of the gate or, alternatively, through a directional etch process to remove excess fin material following lithographic patterning of the gate. In any case, in such a test device 151, the pseudo channel region 130a will exhibit three-dimensional field effects. However, it should be noted the top surface 131 of the pseudo channel region 130a can be electrically isolated from the gate 180a by a dielectric cap layer (e.g., a silicon nitride cap layer) (not shown) that corresponds to a similar dielectric cap layer in the design for the single-fin FET 250 and, in this case, only two-dimensional field effects will be exhibited.

It should further be noted that, if the semiconductor fin 110 comprises additional first portion(s) 111b, the test device 151 can comprise additional gate(s) 180b adjacent to each additional first portion 111b, respectively, and, particularly, adjacent to the top surface 131 and opposing sides 133-134 of each additional channel region 130b. The additional gate(s) 180b can have essentially the same structure as the gate 180a and the gate pitch (i.e., distance between the center points of the gates) can be the same gate pitch as specified in the design for the single-fin FET 250. Optionally, any additional gate(s) 180b may be electrically connected to the gate 180a. As mentioned above, optionally, in order to limit gate dielectric breakdown in the test device 151, the gate dielectric layer(s) 181 of the gate 180a may be relatively thick as compared to the gate dielectric layer(s) 281 in the design for the single-fin FET 250. The additional gate(s) 180b can have a similar structure with relatively thick gate dielectric layer(s) 181. Those skilled in the art will recognize that typically technology-level design rules for FETs require an increase in gate pitch when there is an increase in gate dielectric thickness. That is, design rules dictate that a standard gate pitch is to be used when a standard gate dielectric thickness is used and that a larger than standard gate pitch is to be used when a larger than standard gate dielectric thickness is used. However, since the test structure 100 incorporates a test device 151 and not an operational FET, meeting such design rules is not necessary. That is, even if a relatively thick dielectric thickness is used in the test device 151, a standard gate pitch can be used.

Optionally, the test device 151 can further comprise a metal silicide layer (not shown) on the top surfaces of any diffusion regions 120a-b and/or any gates 180a-b.

The test device 151 can further comprise a sidewall spacer 190 comprising one or more layers of dielectric spacer material (e.g., silicon dioxide, silicon nitride, silicon oxynitride, etc.) positioned laterally adjacent to the sidewalls of the gate 180a and any additional gates 180b. The sidewall spacer 190 can have essentially the same structure (i.e., can comprise the same materials, dimensions, etc.) as the sidewall spacer 290 in the design for the single-fin FET 250. For example, a first dielectric spacer layer 191 (e.g., a silicon dioxide spacer layer) can be positioned laterally around and immediately adjacent to the sidewalls of the gate(s) 180a-b so as to electrically isolate the gate(s) 180a-b from the diffusion region(s) 120a-b and, particularly, from the epitaxial semiconductor layer 170 when the diffusion region(s) 120a-b are raised. Furthermore, one or more additional dielectric spacer layers 192-193 (e.g., a silicon nitride spacer layer and another silicon dioxide spacer layer) can be positioned laterally adjacent to the first dielectric spacer layer 191.

The test structure 100 can further comprise one or more additional dielectric layers 195 (i.e., interlayer dielectrics) that blanket the test device 151. The additional dielectric layer(s) 195 can be configured in essentially the same manner (i.e., can comprise the same materials, thicknesses, etc.) as the additional dielectric layer(s) 295 in the design for the single-fin FET 250. Thus, for example, the additional dielectric layer(s) 195 can comprise, for example, one or more layers of any of the following dielectric materials: silicon dioxide, a silicon nitride, silicon oxynitride, borophosphosilicate glass (BPSG), etc.

The test device 151 can further comprise a first contact 197 (i.e., an insulator layer contact) and a second contact 196 (i.e., a diffusion region contact). The first contact 197 can extend vertically through the additional dielectric layer(s) 195 to the insulator layer 102 such that it is positioned laterally adjacent to the end 115 of the semiconductor fin 110. The second contact 196 can extend vertically through the additional dielectric layer(s) 195 to the diffusion region 120a such that the gate 180a is positioned laterally between the first contact 197 and the second contact 196. Thus, the first contact 197 will be separated from a first side of the gate 180a by a first distance 161 and the second contact 196 will be separated from a second side of the gate 180a opposite the first side by a second distance 162. Ideally, the gate 180a will be centered between the contacts 196-197 such that the first distance 161 is equal to the second distance 162. However, those skilled in the art will recognize that, due to process variations, the first distance 161 and second distance 162 may vary. In any case, the first contact 197 and the second contact 196 can have essentially the same structure (i.e., can comprise the same materials, widths and lengths, contact pitch, etc.) as the contacts 296 in the design for the single-fin FET 250. It should be understood that the contacts 196-197 will have different depths since they extend vertically to the semiconductor fin 110 and insulator layer 102, respectively. Furthermore, the power supply to the first contact 197, the second contact 196 and the gate 180a should be such that these components are each independently biasable (e.g., so that the first contact 197 is independently biasable against the gate 180a and, similarly, such that the second contact 196 is independently biasable against the gate 180a).

Optionally, this test structure 100 can comprise duplicate test devices on the insulator layer 102. These duplicate test devices (not shown) can have the same design as the test device 151, as described in detail above and illustrated in FIGS. 1A-1C; however, at least some of the duplicate test devices can have different size spaces between the gate 180a and the first contact 197 (i.e., different first distances 161). These different first distances can be the result of process variation in the making of the test devices and/or, by design, given a predictable range of variations in the spacing between the gate and the source/drain contacts when multiple single-fin FETs 250 are formed.

During testing, first measurement(s) of electrical properties (e.g., breakdown voltage, time-to-breakdown under a constant voltage and/or leakage current) can be taken from the test device 151 when the first contact 197 is biased against the gate 180a and second measurement(s) of electrical properties (and, particularly, the same types of measurements) can be taken from the test device 151 when the second contact 196 is biased against the gate 180a. The first measurement(s) can be compared to the second measurement(s) (e.g., a first breakdown voltage can be compared to a second breakdown voltage, a first time-to-breakdown can be compared to a second time-to-breakdown, a first leakage current can be compared to a second leakage current, etc.) in order to assess lateral dielectric breakdown between the gate 180a and the first contact 197 (i.e., breakdown of the dielectric material of the sidewall spacer 190 and of any interlayer dielectrics 195 between the gate 180a and the first contact 197) independent of gate dielectric breakdown (i.e., breakdown of the gate dielectric layer(s) 181 between the gate conductor layer(s) 182 of the gate 180a and the pseudo channel region 130a). Furthermore, such testing can be performed on any duplicate test devices, if present in the test structure 100, and the results of testing the test device 151 and any duplicate test devices can be compiled in order to better predict the performance and reliability of the single-fin FET.

Similar test structures can comprise test devices(s) for more-complex non-planar semiconductor structures, such as multi-fin FETs, electronic components comprising a plurality of multi-fin FETs that share a gate, etc.

Figure 3A:
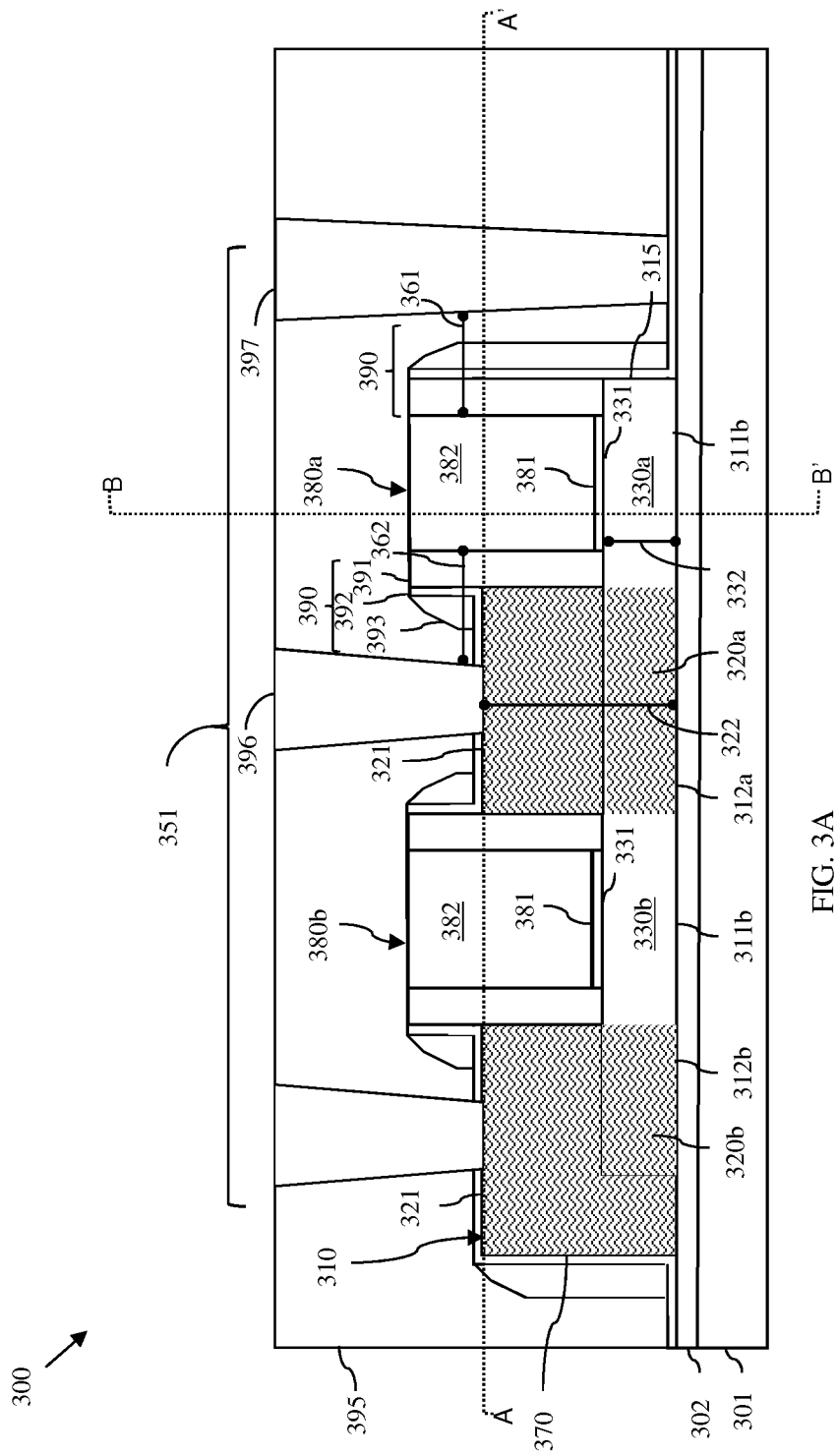
FIG. 3A is a cross-section diagram of a test structure for a multi-fin FET along a vertical plane.
Figure 3B:
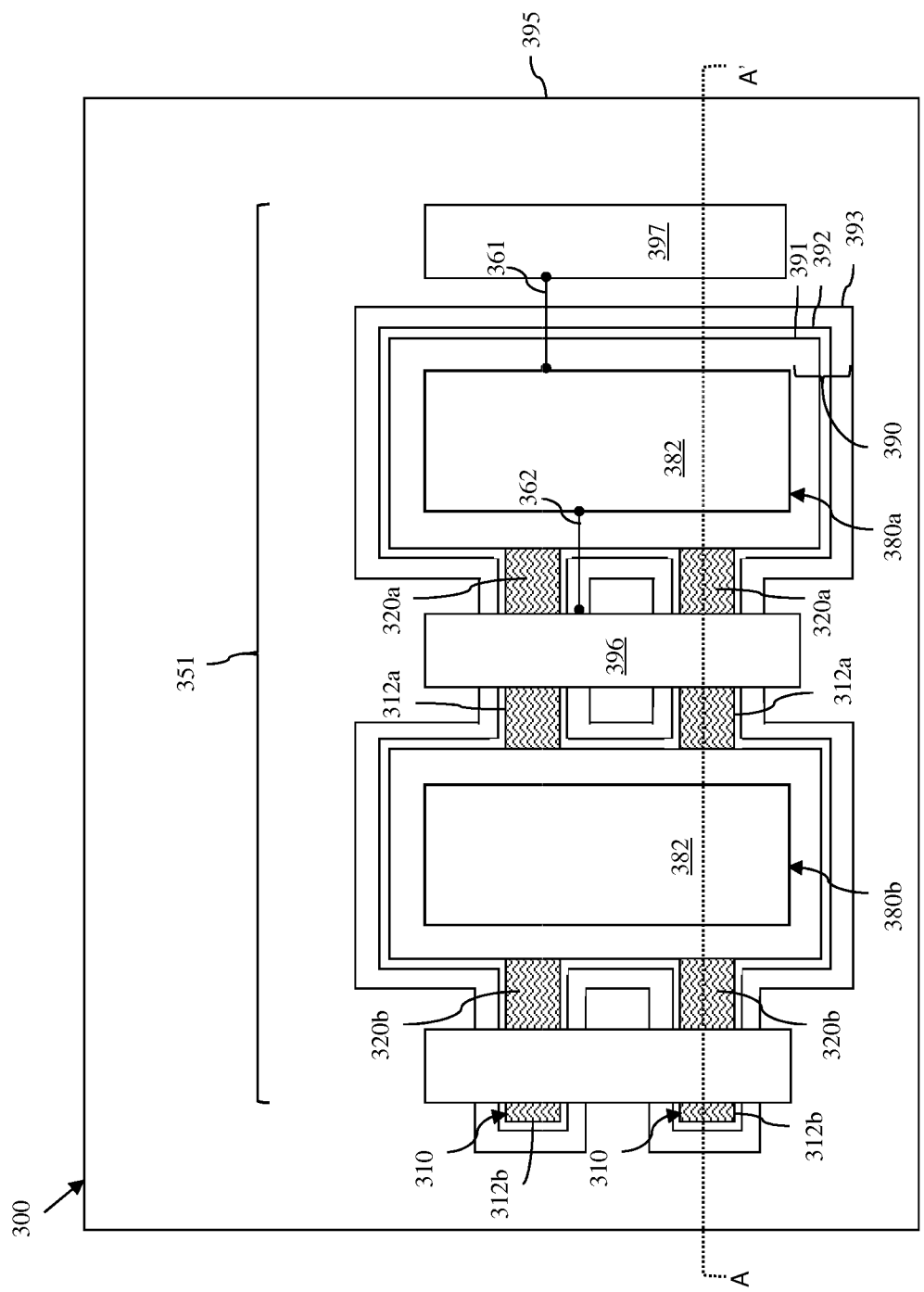
FIG. 3B is another cross-section diagram of the test structure of FIG. 3A along a horizontal plane A-A', as identified in FIG. 3A.
Figure 3C:
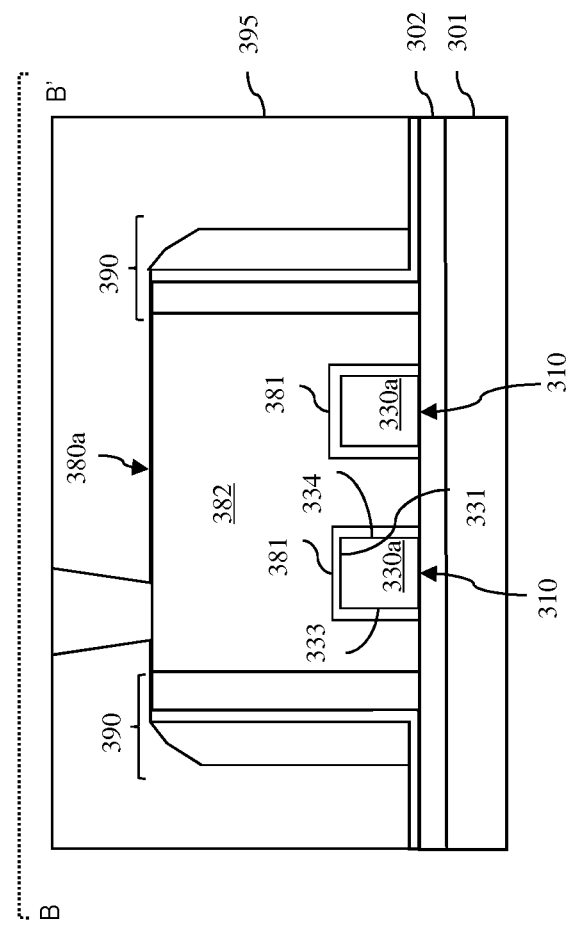
FIG. 3C is yet another cross-section diagram of the test structure of FIG. 1A along another vertical plane B-B', as identified in the FIG. 3A.

For example, FIGS. 3A-3C illustrate different cross-section views of a test structure 300 comprising at least one test device 351 for a multi-fin field effect transistor (FET). Specifically, FIG. 3A is a cross-section diagram of the test structure 300 along a horizontal plane aligned with the top surfaces of multiple semiconductor fins incorporated into the test device 351. FIG. 3B is a cross-section diagram of the same test structure 300 along a vertical plane A-A', as identified in FIG. 3A, that extends across the length of a single one of the multiple semiconductor fins incorporated into the test device 351. FIG. 3C is yet another cross-section diagram of the same test structure 300 along another vertical plane B-B', as identified in the FIG. 3A. Multi-fin FETs are well known in the art and, thus, the details of such a multi-fin FET are omitted from this specification in order to allow the reader to focus on the salient aspect of the disclosed test structure 300.

The test device(s) 351 of the test structure 300 allow lateral dielectric breakdown of a multi-fin FET having a specific design to be assessed without the influence of gate dielectric breakdown and, thereby allows the performance and reliability of that multi-fin FET to be better predicted. More particularly, referring to FIGS. 3A-3C in combination, the test structure 300 can comprise a semiconductor substrate 301 (e.g., a silicon substrate or any other suitable semiconductor substrate) and an insulator layer 302 (e.g., a silicon dioxide layer or any other suitable insulator layer) on the semiconductor substrate 301. The test structure 300 can further comprise at least one test device 351 for a multi-fin FET on the insulator layer 302.

The test device 351 can specifically comprise multiple semiconductor fins 310 on the insulator layer 302. These multiple semiconductor fins 310 can be arranged in parallel. For purposes of illustration, two semiconductor fins 310 are shown; however, it should be understood that the test device 351 can comprise any number of two or more semiconductor fins corresponding to the same number of semiconductor fins as in the design of the multi-fin FET. Furthermore, each semiconductor fin 310 can comprise the same semiconductor material, dimensions, etc. as in the design for the multi-fin FET. Thus, for example, each semiconductor fin 310 can comprise a silicon fin, a silicon germanium fin, a hybrid semiconductor fin having end portions comprising a first semiconductor material and a center portion comprising a second semiconductor material, etc.

In the test device 351, each semiconductor fin 310 can have a first portion 311a at one end 315 and a second portion 312a positioned laterally adjacent to the first portion 311a.

Optionally, each semiconductor fin 310 can further have alternating additional first and second portions (e.g., an additional first portion 311b positioned laterally adjacent to the second portion 312a and an additional second portion 312b positioned laterally adjacent to the additional first portion 311b). Also, optionally, the second portion(s) 312a-b of each semiconductor fin 310 can comprise an additional semiconductor layer 370 (e.g., an epitaxial semiconductor layer, such as an epitaxial silicon layer, epitaxial silicon germanium layer, etc.) such that the first portion(s) 311a-b have a first height 332 as measured from the insulator layer 302 to the top surface 331 of the first portion(s) 311a-b and such that the second portion(s) 312a-b have a second height 322 that is greater than the first height 332 as measured from the insulator layer 302 to the top surface 331 of the first portions 311a-b. Additionally, the first portion(s) 311a-b can have a first width and the second portion(s) 312a-b can have a second width that is greater than the first width (not shown).

In the test device 351, the first portion 311a at the end 315 of each semiconductor fin 310 can comprise a pseudo channel region 330a and the second portion 312a can comprise a diffusion region 320a positioned laterally adjacent to the pseudo channel region 330a. The pseudo channel region 330a and diffusion region 320a can have different doping profiles. More specifically, within each semiconductor fin 310, a pseudo channel region 330a can be positioned in the first portion 311a immediately adjacent the end 315. The pseudo channel region 130a can have essentially the same doping profile as the channel region in the design of the multi-fin FET. As mentioned above, the term "pseudo channel region" refers to that fact that this region 330a is positioned laterally adjacent to only a single diffusion region 320a rather than being positioned laterally between two source/drain diffusion regions. Similarly, the diffusion region 320a can have essentially the same doping profile as a source/drain diffusion region in the design for the multi-fin FET. If present, any additional first portion(s) 311b can comprise additional channel regions 330b and any additional second portion(s) 312b can comprise additional diffusion region(s) 320b having the same doping profiles as the pseudo channel region 330a and diffusion region 320a, respectively. Furthermore, if the second portion(s) 312a-b comprise the additional semiconductor layer 370, the diffusion region 320a and any additional diffusion regions 320b will be considered raised diffusion regions. It should be understood that in the test device 351 each semiconductor fin 310 may further comprise one or more additional doped regions (not shown) positioned between the diffusion region 320a and the pseudo channel region 330a (e.g., an extension region and/or a halo region) and/or between any additional diffusion region(s) 320b and additional channel region(s) 330b. Such additional doped regions can correspond to similar additional doped regions in the design of the multi-fin FET.

The test device 351 can further comprise a gate 380a. Generally, the gate 380a can have essentially the same structure (i.e., can comprise the same materials, etc.) as the gate in the design for the multi-fin FET. For example, the gate 380a can comprise one or more gate dielectric layers 381 (e.g., a silicon dioxide layer, a silicon nitride layer, a silicon oxynitride layer, a high-k dielectric layer, etc.) and one or more gate conductor layers 182 (e.g., doped polysilicon layer(s), metal layer(s), metal alloy layer(s) etc.) on the gate dielectric layer(s) 381. Optionally, however, the gate dielectric layer(s) 381 may be relatively thick as compared to the gate dielectric layer(s) in the design for the multi-fin FET. The thicker gate dielectric layer(s) 381 can be incorporated into test device 351 in order to limit any gate dielectric breakdown.

Although many of the features of the test device 351 will be similar to the multi-fin FET, placement of the gate 380a in the test device 351 will, by design, be different than placement of the gate in the multi-fin FET. Specifically, those skilled in the art will recognize that in a multi-fin FET, the gate typically traverses the semiconductor fins such that it is positioned adjacent to the top surface and opposing sides of the channel region in each semiconductor fin and the channel region in each semiconductor fin is positioned laterally between two source/drain diffusion regions. Contrarily, in the test device 351, the gate 380a traverses the semiconductor fins 310 such that it is position on the top surface 331 and opposing sides 333-334 of the pseudo channel regions 330a in each semiconductor fin 310 and, as mentioned above, each pseudo channel region 330a is positioned at the end 315 of a semiconductor fin 310 such that it is only adjacent to a single diffusion region 320a. Those skilled in the art will recognize that alignment of the gate 380a on the first portion 311a at the end 315 of each semiconductor fin 310 can be achieved, during processing, through precise lithographic patterning of the gate or, alternatively, through a directional etch process to remove excess fin material following lithographic patterning of the gate.

In any case, in such a test device 351, each pseudo channel region 330a in each semiconductor fin 310 will exhibit three-dimensional field effects. However, it should be noted the top surface 331 of each pseudo channel region 330a in each semiconductor fin 310 can be electrically isolated from the gate 380a by a dielectric cap layer (e.g., a silicon nitride cap layer) (not shown) that corresponds to a similar dielectric cap layer in the design for the multi-fin FET and, in this case, only two-dimensional field effects will be exhibited.

It should further be noted that, if the semiconductor fins 310 each comprise additional first portion(s) 311b, the test device 351 can comprise additional gate(s) 380b traversing the semiconductor fins 310 such that they are adjacent to each additional first portion 311b, respectively, and, particularly, adjacent to the top surface 331 and opposing sides 333-334 of each additional channel region 330b. The additional gate(s) 380b can have essentially the same structure as the gate 380a and the gate pitch (i.e., distance between the center points of the gates) can be the same gate pitch as in the design for the multi-fin FET. Optionally, any additional gate(s) 380b may be electrically connected to the gate 380a. As mentioned above, optionally, in order to limit gate dielectric breakdown in the test device 351, the gate dielectric layer(s) 381 of the gate 380a may be relatively thick as compared to the gate dielectric layer(s) in the design for the multi-fin FET. The additional gate(s) 380b can have a similar structure with relatively thick gate dielectric layer(s) 381. Those skilled in the art will recognize that typically technology-level design rules for FETs require an increase in gate pitch when there is an increase in gate dielectric thickness. That is, design rules dictate that a standard gate pitch is to be used when a standard gate dielectric thickness is used and that a larger than standard gate pitch is to be used when a larger than standard gate dielectric thickness is used. However, since the test structure 300 incorporates a test device 351 and not an operational FET, meeting such design rules is not necessary. That is, even if a relatively thick dielectric thickness is used in the test device 351, a standard gate pitch can be used.

Optionally, the test device 351 can further comprise a metal silicide layer (not shown) on the top surfaces of any diffusion regions 320a-b and/or any gates 380a-b.

The test device 351 can further comprise a sidewall spacer 390 comprising one or more layers of dielectric spacer material (e.g., silicon dioxide, silicon nitride, silicon oxynitride, etc.) positioned laterally adjacent to the sidewalls of the gate 380a and any additional gates 380b. The sidewall spacer 390 can have essentially the same structure (i.e., can comprise the same materials, dimensions, etc.) as a gate sidewall spacer in the design for the multi-fin FET. For example, a first dielectric spacer layer 391 (e.g., a silicon dioxide spacer layer) can be positioned laterally around and immediately adjacent to the sidewalls of the gate(s) 380a-b so as to electrically isolate the gate(s) 380a-b from the diffusion region(s) 320a-b n each semiconductor fin 310 and, particularly, from the epitaxial semiconductor layer 370 when the diffusion region(s) 320a-b are raised. Furthermore, one or more additional dielectric spacer layers 392-393 (e.g., a silicon nitride spacer layer and another silicon dioxide spacer layer) can be positioned laterally adjacent to the first dielectric spacer layer 391.

The test structure 300 can further comprise one or more additional dielectric layers 395 (i.e., interlayer dielectrics) that blanket the test device 351. The additional dielectric layer(s) 395 can be configured in essentially the same manner (i.e., can comprise the same materials, thicknesses, etc.) as the additional dielectric layer(s) in the design for the multi-fin FET. Thus, for example, the additional dielectric layer(s) 395 can comprise, for example, one or more layers of any of the following dielectric materials: silicon dioxide, a silicon nitride, silicon oxynitride, borophosphosilicate glass (BPSG), etc.

The test device 351 can further comprise a first contact 397 (i.e., an insulator layer contact) and a second contact 396 (i.e., a diffusion region contact). The first contact 397 can extend vertically through the additional dielectric layer(s) 395 to the insulator layer 302 such that it is positioned laterally adjacent to the ends 315 of each of the semiconductor fins 310. The second contact 396 can extend vertically through the additional dielectric layer(s) 395 and can traverse the semiconductor fins 310 such that it lands on the diffusion regions 320a in each of the semiconductor fins 310. Thus, the gate 380a will be positioned laterally between the first contact 397 and the second contact 396, the first contact 397 will be separated from a first side of the gate 380a by a first distance 361 and the second contact 396 will be separated from a second side of the gate 380a opposite the first side by a second distance 362. Ideally, the gate 380a will be centered between the contacts 396-397 such that the first distance 361 is equal to the second distance 362. However, those skilled in the art will recognize that, due to process variations, the first distance 361 and second distance 362 may vary. In any case, the first contact 397 and the second contact 396 can have essentially the same structure (i.e., can comprise the same materials, widths and lengths, contact pitch, etc.) as the source/drain contacts in the design for the multi-fin FET. It should be understood that the contacts 396 and 397 will have different depths since they extend vertically to the semiconductor fins 310 and insulator layer 302, respectively. Furthermore, the power supply to the first contact 397, the second contact 396 and the gate 380a should be such that these components are each independently biasable (e.g., so that the first contact 397 is independently biasable against the gate 380a and, similarly, such that the second contact 396 is independently biasable against the gate 380a).

Optionally, this test structure 300 can comprise duplicate test devices on the insulator layer 302. These duplicate test devices (not shown) can have the same design as the test device 351, as described in detail above and illustrated in FIGS. 3A-3C; however, at least some of the duplicate test devices can have different size spaces between the gate 380a and the first contact 397 (i.e., different first distances 361). These different first distances can be the result of process variation in the making of the test devices and/or, by design, given a predictable range of variations in spacing between gates and source/drain contacts when multiple multi-fin FETs are formed.

During testing, first measurement(s) of electrical properties (e.g., breakdown voltage, time-to-breakdown under a constant voltage and/or leakage current) can be taken from the test device 351 when the first contact 397 is biased against the gate 380a and second measurement(s) of electrical properties (and, particularly, the same types of measurements) can be taken from the test device 351 when the second contact 396 is biased against the gate 380a. The first measurement(s) can be compared to the second measurement(s) (e.g., a first breakdown voltage can be compared to a second breakdown voltage, a first time-to-breakdown can be compared to a second time-to-breakdown, a first leakage current can be compared to a second leakage current, etc.) in order to assess lateral dielectric breakdown between the gate 380a and the first contact 397 (i.e., breakdown of the dielectric material of the sidewall spacer 390 and of any interlayer dielectrics 395 between the gate 380a and the first contact 397) independent of gate dielectric breakdown (i.e., breakdown of the gate dielectric layer(s) 381 between the gate conductor layer(s) 382 of each gate 380a and each pseudo channel region 330a). Furthermore, such testing can be performed on any duplicate test devices, if present in the test structure 300, and the results of testing the test device 351 and any duplicate test devices can be compiled in order to better predict the performance and reliability of the multi-fin FET.

Figure 4A:
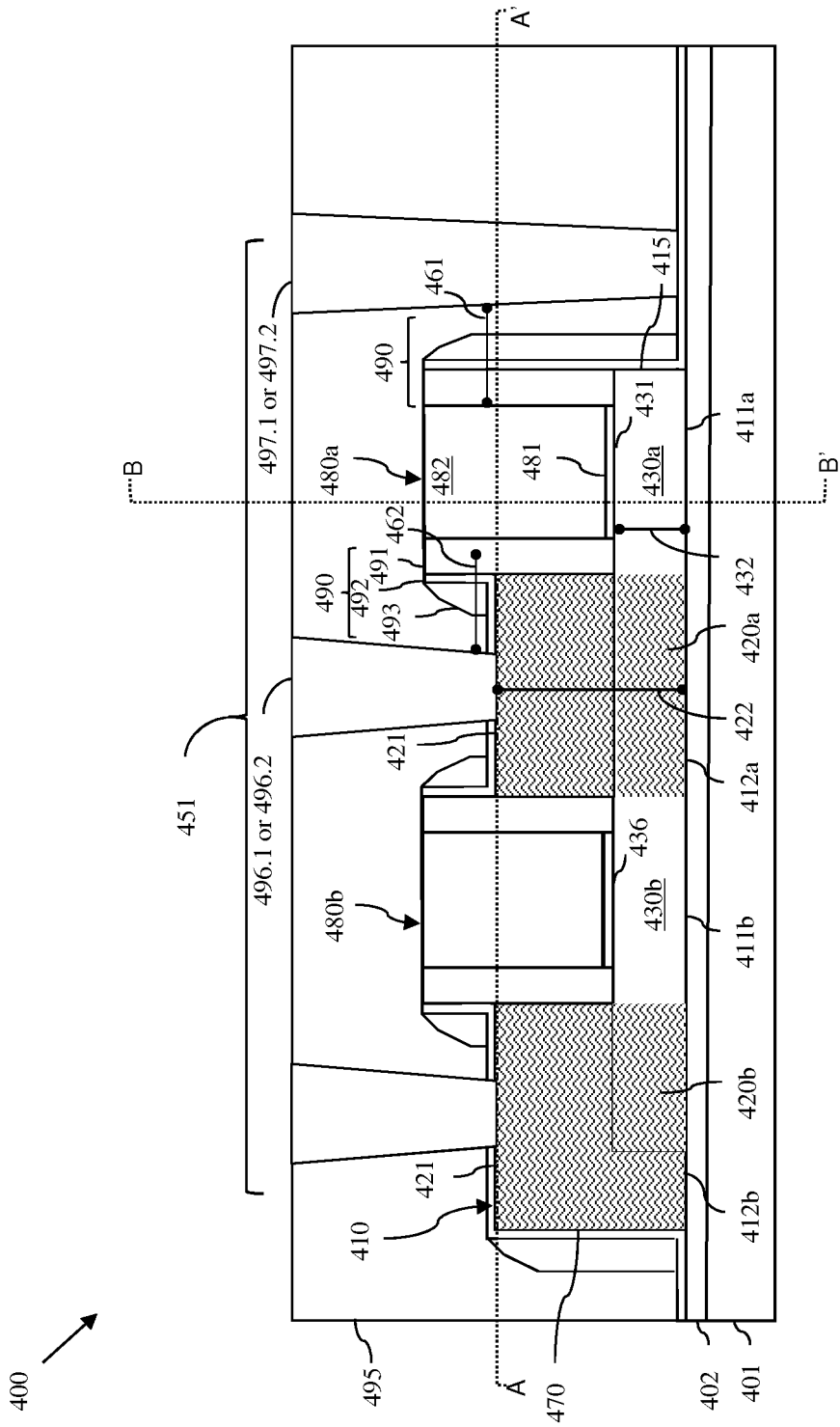
FIG. 4A is a cross-section diagram of a test structure for an electronic component comprising multiple multi-fin FETs with a shared gate along a vertical plane.
Figure 4B:
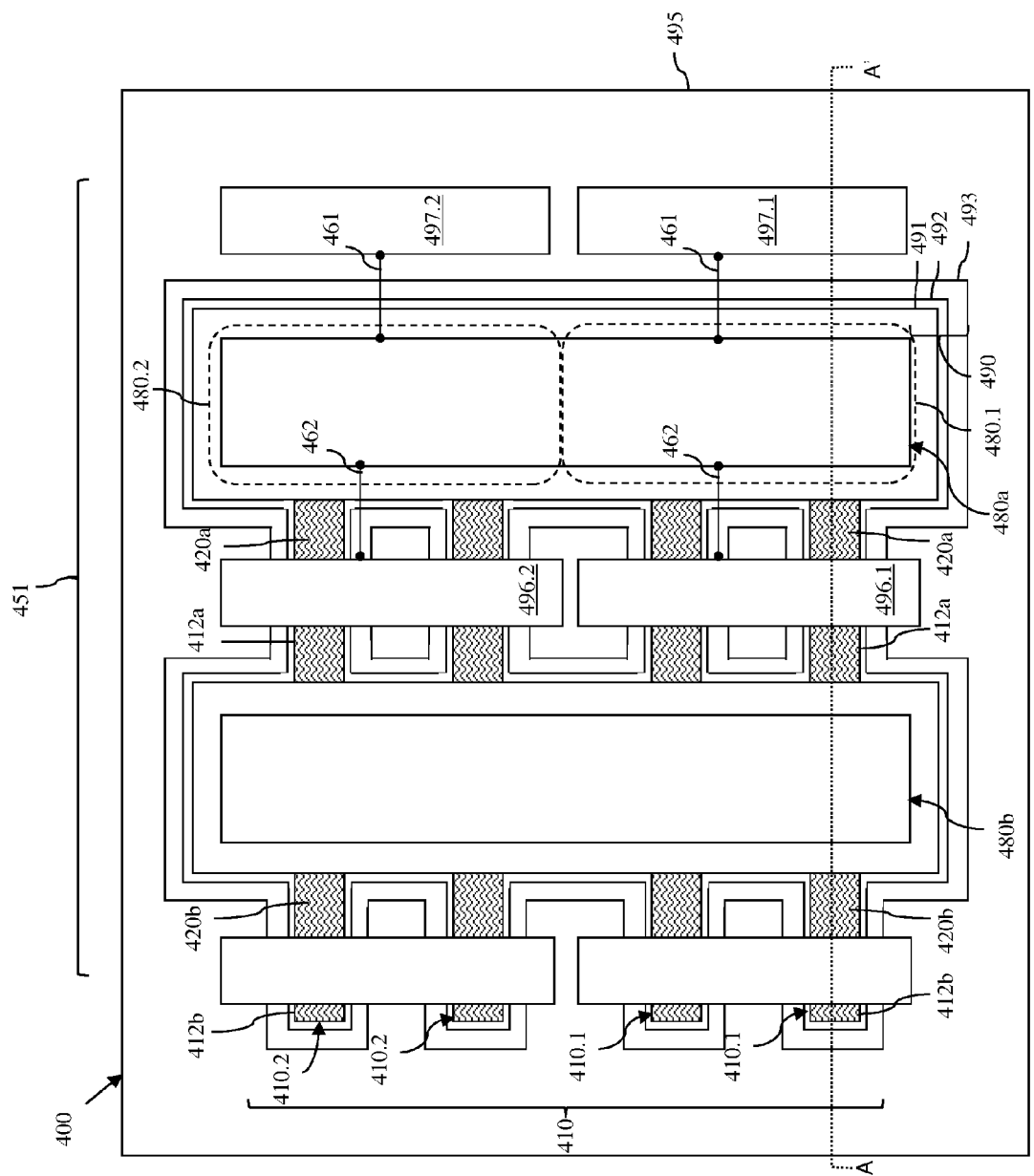
FIG. 4B is another cross-section diagram of the test structure of FIG. 4A along a horizontal plane A-A', as identified in FIG. 4A.
Figure 4C:
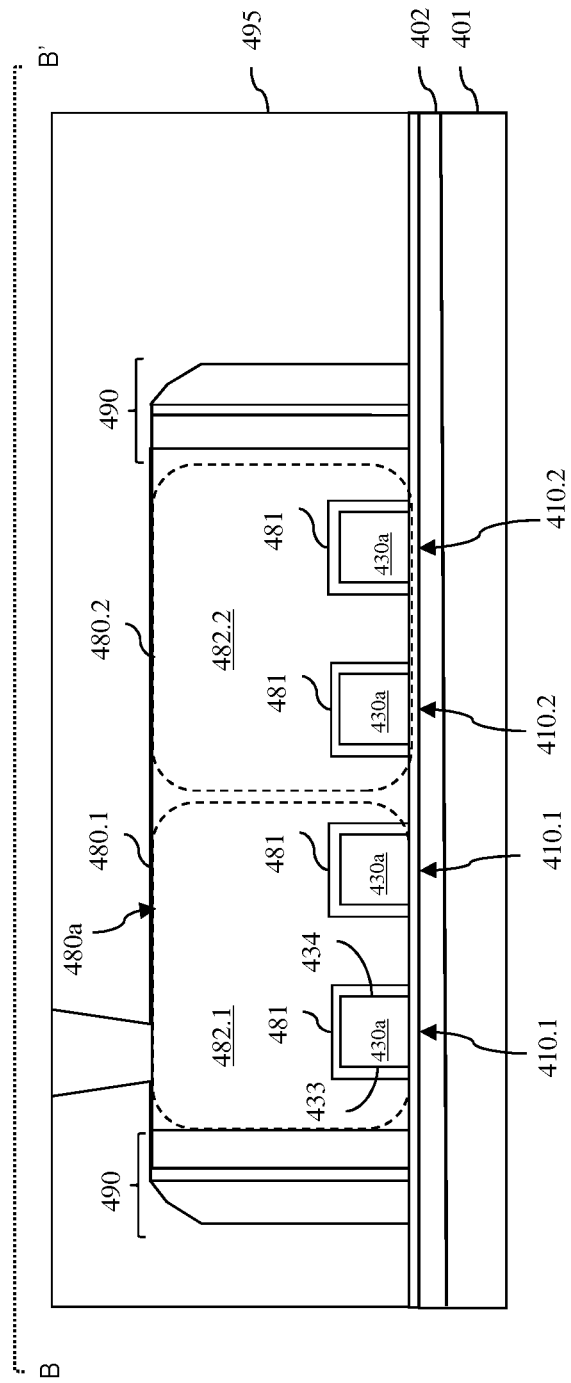
FIG. 4C is yet another cross-section diagram of the test structure of FIG. 4A along another vertical plane B-B', as identified in the FIG. 4A; and, FIG. 5 is a flow diagram illustrating a testing method using the disclosed test structures.

FIGS. 4A-4C illustrate different cross-section views of a test structure 400 comprising at least one test device 451 for an electrical component that incorporates multiple multi-fin field effect transistors (FET), including both a first type conductivity (e.g., N-type) multi-fin FET and a second type conductivity (e.g., P-type) multi-fin FET, having a shared gate. Specifically, FIG. 4A is a cross-section diagram of the test structure 400 along a horizontal plane aligned with the top surfaces of multiple semiconductor fins incorporated into the test device 451. FIG. 4B is a cross-section diagram of the same test structure 400 along a vertical plane A-A', as identified in FIG. 4A, that extends across the length of a single one of the multiple semiconductor fins incorporated into the test device 451. FIG. 4C is yet another cross-section diagram of the same test structure 400 along another vertical plane B-B', as identified in the FIG. 4A. Electrical components that incorporate multiple multi-fin FETs that share a gate are well known in the art and, thus, the details of such electrical components are omitted from this specification in order to allow the reader to focus on the salient aspect of the disclosed test structure 400.

The test device(s) 451 of the test structure 400 allow lateral dielectric breakdown of multiple multi-fin FETs in an electronic component of specific design to be assessed without the influence of gate dielectric breakdown and, thereby allows the performance and reliability of that electrical component to be better predicted. More particularly, referring to FIGS. 4A-4C, the test structure 400 can comprise a semiconductor substrate 401 (e.g., a silicon substrate or any other suitable semiconductor substrate) and an insulator layer 402 (e.g., a silicon dioxide layer or any other suitable insulator layer) on the semiconductor substrate 401. The test structure 400 can further comprise at least one test device 451 on the insulator layer 402.

The test device 451 can specifically comprise multiple semiconductor fins 410 on the insulator layer 402 and, particularly, can comprise a group of multiple first semiconductor fins 410.1 arranged in parallel and a group of multiple second semiconductor fins 410.2 arranged in parallel with each other and with the first semiconductor fins 410.1. For purposes of illustration, two first semiconductor fins 410.1 and two second semiconductor fins 410.2 are shown; however, it should be understood that the test device 451 can comprise any number of one or more first semiconductor fins and any number of one or more second semiconductor fins corresponding to the same number of first semiconductor fins for a first type conductivity multi-fin FET and the same number of second semiconductor fins for a second type conductivity multi-fin FET as in the multiple multi-fin FETs in the design of the electronic component.

In the test device 451, each semiconductor fin 410 can have a first portion 411a at one end 415 and a second portion 412a positioned laterally adjacent to the first portion 411a.

Optionally, each semiconductor fin 410 can further have alternating additional first and second portions (e.g., an additional first portion 411b positioned laterally adjacent to the second portion 412a and an additional second portion 412b positioned laterally adjacent to the additional first portion 411b). Also, optionally, the second portion(s) 412a-b of each semiconductor fin 410 can comprise an additional semiconductor layer 470 (e.g., an epitaxial semiconductor layer, such as an epitaxial silicon layer, epitaxial silicon germanium layer, etc.) such that the first portion(s) 411a-b ave a first height 432 as measured from the insulator layer 402 to the top surface 431 of the first portion(s) 411a-b and such that the second portion(s) 412a-b have a second height 422 that is greater than the first height 432 as measured from the insulator layer 402 to the top surface 431 of the first portions 411a-b. Additionally, the first portion(s) 411a-b can have a first width and the second portion(s) 412a-b can have a second width that is greater than the first width (not shown).

In the test device 451, the first portion 411a at the end 415 of each semiconductor fin 410 can comprise a pseudo channel region 430a and the second portion 412a can comprise a diffusion region 420a positioned laterally adjacent to the pseudo channel region 430a. The pseudo channel region 430a and diffusion region 420a can have different doping profiles. Furthermore, the doping profiles can be different between the first semiconductor fins 410.1 and second semiconductor fins 410.2 and, more particularly, can corresponding to the different doping profiles for the channel regions and source/drain diffusion regions in the semiconductor fins of the first type conductivity (e.g., N-type) multi-fin FET and the second type conductivity (e.g., P-type) multi-fin FET, respectively, in the design for the electric component. More specifically, the first semiconductor fins 410.1 can each further comprise a first pseudo channel region at one end 415 and a first diffusion region positioned laterally adjacent to the first pseudo channel region, wherein the first pseudo channel region and first diffusion region have different doping profiles. These different doping profiles can be essentially the same as the doping profiles of the channel region and source/drain diffusion regions of the first type conductivity multi-fin FET in the design for the electronic component. Similarly, the second semiconductor fins 410.2 can each further comprise a second pseudo channel at one end 415 and a second diffusion region positioned laterally adjacent to the second pseudo channel region, wherein the second pseudo channel region and second diffusion region have different doping profiles. These doping profiles can be essentially the same as the doping profiles of the channel region and source/drain diffusion regions of the second type conductivity multi-fin FET in the design for the electronic component. Thus, for example, within each first semiconductor fin 410.1, the first diffusion region can have a first type conductivity (e.g., N-type conductivity) and the first pseudo channel region can have either a second type conductivity (e.g., P-type conductivity) or the first type conductivity at a lesser conductivity level; whereas, within each second semiconductor fin, the second diffusion region can have the second type conductivity (e.g., P-type conductivity) and the second pseudo channel region can have either the first type conductivity (e.g., N-type conductivity) or the second type conductivity at a lesser conductivity level. The term "pseudo channel region" refers to that fact that the regions 430a in both the first and second semiconductor fins 410.1 and 410.2 are positioned laterally adjacent to only a single diffusion region 420a rather than being positioned laterally between two source/drain diffusion regions, as is typically the case for a channel region.

It should be noted that, if present in the semiconductor fins 410, any additional first portion(s) 411b can comprise additional channel regions 430b and any additional second portion(s) 412b can comprise additional diffusion region(s) 420b. These additional first portion(s) 411b and additional channel region(s) can have the same doping profiles as the pseudo channel region 330a and diffusion region 420a, respectively, in the same fin. Furthermore, if the second portion(s) 412a-b comprise the additional semiconductor layer 470, the diffusion region 420a and any additional diffusion regions 420b will be considered raised diffusion regions.

Additionally, it should be understood that, in the test device 451, each semiconductor fin 410 may further comprise one or more additional doped regions (not shown) positioned between the diffusion region 420a and the pseudo channel region 430a (e.g., an extension region and/or a halo region) and/or between any additional diffusion region(s) 420b and additional channel region(s) 430b. Such additional doped regions can correspond to similar additional doped regions in the corresponding multi-fin FET in the design for the electronic component.

The test device 451 can further comprise a shared gate 480a that traverses all of the semiconductor fins 410 (i.e., the first semiconductor fins 410.1 and the second semiconductor fins 410.2). Generally, the gate 480a can have essentially the same structure (i.e., can comprise the same materials, etc.) as a shared gate for the multiple multi-fin FETs in the design for the electronic component. As with any gate, the gate 480a can comprise one or more gate dielectric layers 481 and one or more gate conductor layers 482 on the gate dielectric layer(s). However, the gate 480a can further comprise a first section 480.1 and a second section 480.2. The first section 480.1 can be adjacent to the first pseudo channel region in each of the first semiconductor fins 410.1 and the second section 480.2 can be adjacent to the second pseudo channel region in each of the second semiconductor fins 410.2. The first section 480.1 and second sections 480.2 can each have different work functions due to different gate dielectric layer(s) and/or different gate conductor layer(s) and/or different thicknesses thereof. The different work functions can be appropriate for the different type of FETs. Optionally, however, the gate dielectric layer(s) 481 in the first section 480.1 and/or the second section 480.2 of the shared gate 480a may be relatively thick as compared to the gate dielectric layer(s) for the shared gate of the multiple multi-fin FETs in the design for the electronic component. The thicker gate dielectric layer(s) can be incorporated into test device in order to limit any gate dielectric breakdown.

Although many of the features of the test device 451 will be similar to the electronic component, placement of the shared gate 480a in the test device 451 will, by design, be different than placement of the shared gate relative to the multi-fin FETs in the electronic component. Specifically, those skilled in the art will recognize that in multi-fin FETs, the shared gate typically traverses the semiconductor fins such that it is positioned adjacent to the top surface and opposing sides of the channel region in each semiconductor fin and the channel region in each semiconductor fin is positioned laterally between two source/drain diffusion regions. Contrarily, in the test device 451, the shared gate 480a traverses the semiconductor fins 410 such that it is position on the top surface 431 and opposing sides 433-434 of the pseudo channel regions 430a in each semiconductor fin 410 and, as mentioned above, each pseudo channel region 430a is positioned at the end of a semiconductor fin 410 such that it is only adjacent to a single diffusion region 420a. Those skilled in the art will recognize that alignment of the gate 480a on the first portion 411a at the end 415 of each semiconductor fin 410 can be achieved, during processing, through precise lithographic patterning of the gate or, alternatively, through a directional etch process to remove excess fin material following lithographic patterning of the gate.

In any case, in such a test device 451, each pseudo channel region 430a in each semiconductor fin 410 will exhibit three-dimensional field effects. However, it should be noted the top surface 431 of each pseudo channel region 430a in each semiconductor fin 410 can be electrically isolated from the gate 480a by a dielectric cap layer (e.g., a silicon nitride cap layer) (not shown) that corresponds to a similar dielectric cap layer in the design for the electronic component and, in this case, only two-dimensional field effects will be exhibited.

It should further be noted that, if the semiconductor fins 410 each comprise additional first portion(s) 411b, the test device 451 can comprise additional gate(s) 480b traversing the semiconductor fins 410 such that they are adjacent to each additional first portion 411b, respectively, and, particularly, adjacent to the top surface 431 and opposing sides 433-434 of each additional channel region 430b. The additional gate(s) 480b can have essentially the same structure as the gate 480a and the gate pitch (i.e., distance between the center points of the gates) can be the same gate pitch as in the design for the electronic component. Optionally, any additional gate(s) 480b may be electrically connected to the gate 480a. As mentioned above, optionally, in order to limit gate dielectric breakdown in the test device 451, the gate dielectric layer(s) 481 of the first and/or second sections 480.1-480.2 of the gate 480a may be relatively thick as compared to the gate dielectric layer(s) in the multiple multi-fin FETs in the design for the electronic component. The additional gate(s) 480b can have a similar structure with relatively thick gate dielectric layer(s) 481. Those skilled in the art will recognize that typically technology-level design rules for FETs require an increase in gate pitch when there is an increase in gate dielectric thickness. That is, design rules dictate that a standard gate pitch is to be used when a standard gate dielectric thickness is used and that a larger than standard gate pitch is to be used when a larger than standard gate dielectric thickness is used. However, since the test structure 400 incorporates a test device 451 and not an operational FET, meeting such design rules is not necessary. That is, even if a relatively thick dielectric thickness is used in the test device 451, a standard gate pitch can be used.

Optionally, the test device 451 can further comprise a metal silicide layer (not shown) on the top surfaces of any diffusion regions 420a-b and/or any gates 380a-b.

The test device 451 can further comprise a sidewall spacer 490 comprising one or more layers of dielectric spacer material (e.g., silicon dioxide, silicon nitride, silicon oxynitride, etc.) positioned laterally adjacent to the sidewalls of the gate 480a and any additional gates 380b. The sidewall spacer 490 can have essentially the same structure (i.e., can comprise the same materials, dimensions, etc.) a gate sidewall spacer in the design for the electronic component. For example, a first dielectric spacer layer 491 (e.g., a silicon dioxide spacer layer) can be positioned laterally around and immediately adjacent to the sidewalls of the gate(s) 480a-b so as to electrically isolate the gate(s) 480a-b from the diffusion region(s) 420a-b in each semiconductor fin 410 and, particularly, from the epitaxial semiconductor layer 470 when the diffusion region(s) 420a-b are raised. Furthermore, one or more additional dielectric spacer layers 492-493 (e.g., a silicon nitride spacer layer and another silicon dioxide spacer layer) can be positioned laterally adjacent to the first dielectric spacer layer 491.

The test structure 400 can further comprise one or more additional dielectric layers 495 (i.e., interlayer dielectrics) that blanket the test device 451. The additional dielectric layer(s) 495 can be configured in essentially the same manner (i.e., can comprise the same materials, thicknesses, etc.) as specified for the additional dielectric layer(s) in the design for the multi-fin FET. Thus, for example, the additional dielectric layer(s) 495 can comprise, for example, one or more layers of any of the following dielectric materials: silicon dioxide, a silicon nitride, silicon oxynitride, borophosphosilicate glass (BPSG), etc.

The test device 451 can further comprise first contacts 497.1-497.2 (i.e., insulator layer contacts) and second contacts 496.1-496.2 (i.e., a diffusion region contact). The first contacts 497.1-497.2 can extend vertically through the additional dielectric layer(s) 495 to the insulator layer 402 such that they are positioned laterally adjacent to the ends 415 of the first semiconductor fins 410.1 and second semiconductor fins 410.2, respectively. The second contacts 496.1-496.2 can extend vertically through the additional dielectric layer(s) 495 and can traverse the first semiconductor fins 410.1 and second semiconductor fins 410.2, respectively, such that they land on the diffusion regions 420a of the first semiconductor fins 410.1 and second semiconductor fins 410.2, respectively. Thus, the shared gate 480a will be positioned laterally between the first contacts 497.1-497.2 and the second contacts 496.1-496.2. Furthermore, it should be noted that the first contacts 497.1-497.2 will be separated from a first side of the gate 480a by a first distance 461 and the second contacts 496.1-496.2 will be separated from a second side of the gate 480a opposite the first side by a second distance 462. Ideally, the gate 480a will be centered between the first and second contacts such that the first distance 461 is equal to the second distance 462. However, those skilled in the art will recognize that, due to process variations, the first distance 461 and second distance 462 may vary. In any case, the first contacts 497.1-497.2 and the second contacts 496.1-496.2 can have essentially the same structure (i.e., can comprise the same materials, widths and lengths, contact pitch, etc.) as the source/drain contacts of the multiple multi-fin FETs in the design for the electronic component. It should be understood that the first and second contacts will have different depths since they extend vertically to the semiconductor fins 410 and insulator layer 402, respectively. Furthermore, the power supply to these contacts and the gate 480a should be such that these components are each independently biasable (e.g., so that each of the contacts is independently biasable against the gate 480a).

Optionally, this test structure 400 can comprise duplicate test devices on the insulator layer 402. These duplicate test devices (not shown) can have the same design as the test device 451, as described in detail above and illustrated in FIGS. 4A-4C; however, at least some of the duplicate test devices can have different size spaces between the gate 480a and the first contacts 497.1-497.2 (i.e., different first distances 461). These different first distances can be the result of process variation in the making of the test devices and/or, by design, given a predictable range of variations in spacing between gates and source/drain contacts when multiple multi-fin FETs with a shared gate are formed.

During testing, first measurement(s) of electrical properties (e.g., breakdown voltage, time-to-breakdown under a constant voltage and/or leakage current) can be taken from the test device 451 when the first contacts 497.1, 497.2 are biased against the gate 480a and second measurement(s) of electrical properties (and, particularly, the same types of measurements) can be taken from the test device 451 when the second contacts 496.1, 496.2 are biased against the gate 480a. The first measurement(s) can be compared to the second measurement(s) (e.g., a first breakdown voltage can be compared to a second breakdown voltage, a first time-to-breakdown can be compared to a second time-to-breakdown, a first leakage current can be compared to a second leakage current, etc.) in order to assess lateral dielectric breakdown (i.e., breakdown of the dielectric material of the sidewall spacer 490 and any interlayer dielectrics 495 between the gate 480a and the first contacts 497.1, 497.2) independent of gate dielectric breakdown (i.e., breakdown of the gate dielectric layer(s) between the gate conductor layer(s) and the pseudo channel regions 430a in each of the semiconductor fins 410). Furthermore, such testing can be performed on any duplicate test devices, if present in the test structure 400, and the results of testing the test device 451 and any duplicate test devices can be compiled in order to better predict the performance and reliability of the electronic component.

It should be noted that each of the test structures 100, 300 and 400 described above and illustrated in FIGS. 1A-1C, 3A-3C and 4A-4C can be formed using conventional processing techniques for non-planar semiconductor structures. However, gate alignment to the fin ends (i.e., alignment of the gates 180a, 380a, 480a such that they are at the ends 115, 315, 415 of the semiconductor fins 110, 310, 410 in the test devices 151, 351, 451) can be achieved, during processing, through precise lithographic patterning of the gate or, alternatively, through a directional etch process to remove excess fin material following lithographic patterning of the gate.

Figure 5:
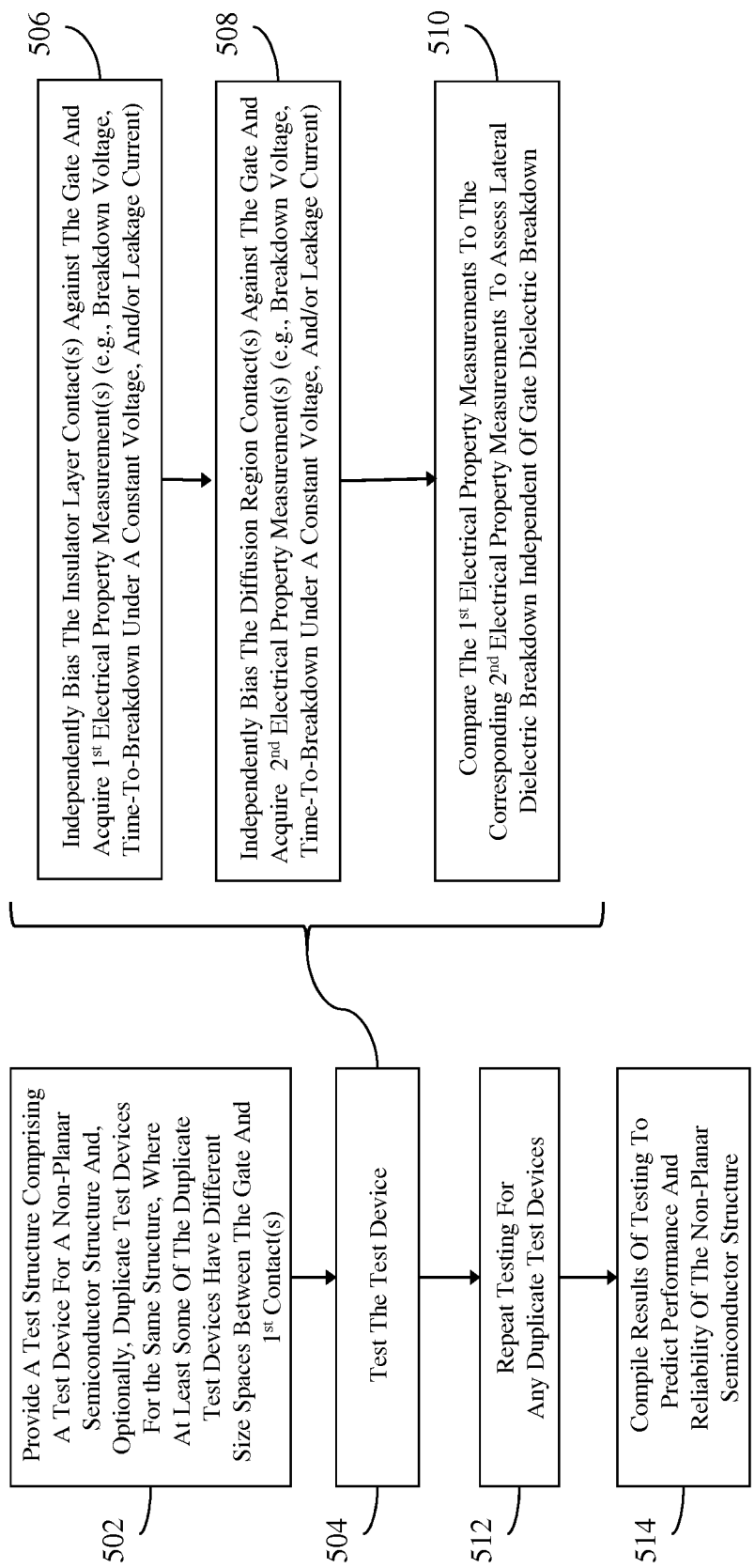

Referring to the flow diagram of FIG. 5, also disclosed herein are embodiments of a testing method. The method can comprise providing any of the test structures 100, 300 or 400, as described in detail above and illustrated in FIGS. 1A-1C, FIGS. 3A-3C, or FIGS. 4A-4C, respectively, where the test structure 100, 300 or 400 comprises a test device 151, 351, 451 for a particular non-planar semiconductor structure, such as a single-fin field effect transistor (FET), a multi-fin FET or an even more-complex non-planar structure (e.g., an electrical component comprising a plurality of multi-fin FETs that share a gate) (502). Optionally, the test structure 100, 300, 400 provided at process 502 can further comprise duplicate test devices for the same non-planar semiconductor structure. The duplicate test devices can have the same design as the test device 151, 351, 451, except that at least some of the duplicate test devices can have different size spaces between the gate 180a, 380a, 480a and the first contact(s) 197, 397, 497.1-497.2 to the insulator layer 102, 302, 402 (i.e., different first distances 161, 361, 461). These different first distances can be the result of process variation in the making of the test devices and/or, by design, given a predictable range of variations in spacing between gates and source/drain contacts.

The method can further comprise testing the test device 151, 351, 451 (504). Specifically, to test a test device 151, 351, 451, which was designed to predict the reliability of a particular non-planar semiconductor structure (e.g., a single-fin field effect transistor (FET), a multi-fin FET, or an electronic component comprising multiple multi-fin FETs with a shared gate), the first contact(s) (e.g., 197 of the test device 151, 397 of the test device 351 or 497.1-497.2 of the test device 451), also referred to herein as the insulator layer contacts, can be independently biased against the gate 180a, 380a, 480a and, while the first contact(s) is/are independently biased against the gate, one or more first electrical property measurements can be acquired from the test device 151, 351, 451 (506). The first electrical property measurements can include, but are not limited to, a first breakdown voltage, a first time-to-breakdown given a constant voltage, and/or a first leakage current. For example, the breakdown voltage can be obtained using a voltage ramp test. During this test, the voltage is ramped (i.e., increased) until an abrupt current change occurs and the voltage at which the change occurs is referred to as the breakdown voltage. The time-to-breakdown can be obtained using a constant voltage time-dependent dielectric breakdown test. During this test, a constant voltage stress is applied and leakage is continuously monitored until an abrupt current change occurs. The time at which this change occurs is referred to as the time-to-breakdown.

Additionally (e.g., either before or after independently biasing the first contact(s) against the gate), the second contact(s) (e.g., the second contact 196 of the test device 151, the second contact 396 of the test device 351 or the second contacts 496.1-496.2 of the test device 451), also referred to herein as diffusion region contacts, can be independently biased against the gate 180a, 380a, 480a, and, while the second contact(s) is/are independently biased against the gate, one or more second electrical property measurements, which corresponds to the first electrical property measurement(s), can be acquired from the test device 151, 351, 451 (508). That is, the second electrical property measurements can similarly include, but are not limited to, a second breakdown voltage, a second time-to-breakdown given a constant voltage, and/or a second leakage current.

Then, the first electrical property measurement(s) acquired at process 506 can be compared to the corresponding second electrical property measurement(s) acquired at process 508 in order to assess lateral dielectric breakdown between the gate 180a, 380a, 480a and the first contact(s) 197, 397, 497.1-497.2 (i.e., breakdown of the dielectric material of the sidewall spacer 190, 390, 490 and any interlayer dielectrics 195, 395, 495 between the gate 180a, 380a, 480a and the first contact(s) 197, 397, 497.1, 497.2) independent of gate dielectric breakdown (i.e., breakdown of the gate dielectric layer(s) 181, 381, 481 between the gate conductor layer(s) 182, 382, 482 and the pseudo channel regions 130a, 330a, 430a the semiconductor fin(s) 110, 310, 410) (510). For example, the breakdown voltage distribution associated with the first contact(s) 197, 397, 497.1-497.2 (i.e., the insulator layer contact(s)) in a test device 151, 351, 451 and acquired at process 506 and the breakdown voltage distribution associated with the second contact(s) 196, 396, 496.1-496.2 (i.e., the diffusion region contact(s)) in a test device 151, 351, 451 and acquired at process 508 can be compared, especially at low percentiles. If the breakdown voltage at a low percentile (e.g., 100 ppm) from first contact(s) in a test device is worse than the breakdown voltage at the same percentile from the second contact(s), then the lateral dielectric breakdown in the test device is worse than the gate dielectric breakdown in terms of reliability. Similarly, the time-to-breakdown distributions associated with the first contact(s) 197, 397, 497.1-497.2 (i.e., the insulator layer contact(s)) in a test device 151, 351, 451 and acquired at process 506 and the time-to-breakdown distributions associated with the second contact(s) 196, 396, 496.1-496.2 (i.e., the diffusion region contact(s)) in a test device 151, 351, 451 and acquired at process 508 can be compared, especially at low percentiles. If the time-to-breakdown at a low percentile (e.g., 100 ppm) from first contact(s) in a test device is shorter than the time-to-breakdown at the same percentile from the second contact(s), then the lateral dielectric breakdown is worse than the gate dielectric breakdown in terms of reliability. In the case where duplicate test devices are present on the test structure 100, 300, 400, the method can further comprise repeating the testing process and, particularly, processes 506-510 described above, for each of the duplicate test devices (512) and then compiling the results to predict the reliability of the particular non-planar semiconductor structure at issue (514).

It should be noted that the terminology used herein is for the purpose of describing the disclosed test structure and method and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including", specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are test structures that allow lateral dielectric breakdown to be assessed in non-planar semiconductor structures (e.g., single-fin field effect transistors (FETs), multi-fin FETs, etc.) without the influence of gate dielectric breakdown. These test structures can comprise a test device on an insulator layer. The test device can comprise one or more semiconductor fins having a first portion comprising a pseudo channel region at one end and a second portion comprising a diffusion region positioned laterally adjacent to the first portion. A gate with sidewall spacers can be positioned on the first portion. A first contact can be positioned on the insulator layer adjacent to the end of the semiconductor fin(s) and a second contact can be positioned on the second portion of the semiconductor fin(s) such that the gate is positioned laterally between the first contact and the second contact. Optionally, the test structures can comprise duplicate test devices having the same design with different size spaces between the gate and first contact. During testing, measurement(s) of electrical properties taken from the test device when the first contact is biased against the gate can be compared to measurement(s) of electrical properties taken from the test device when the second contact is biased against the gate in order to assess lateral dielectric breakdown between the gate and the first contact independent of gate dielectric breakdown. Furthermore, such testing can be performed on any duplicate test devices, if present, in order to better predict non-planar semiconductor structure reliability.

What is claimed is:

1. A test structure comprising:
   an insulator layer; and,
   a test device on said insulator layer, said test device comprising:
      a semiconductor fin on said insulator layer, said semiconductor fin comprising a first portion at an end of said semiconductor fin and a second portion positioned laterally adjacent to said first portion;
      a gate on said first portion at said end;
      a sidewall spacer on said gate and further positioned laterally immediately adjacent to said end such that said semiconductor fin does not extend laterally beyond said sidewall spacer;
      a first contact to the insulator layer, said first contact having a first bottom surface immediately adjacent to said insulator layer and said first contact further being positioned laterally adjacent to said end such that said sidewall spacer is positioned laterally between said gate and said first contact; and,
      a second contact to said second portion of said semiconductor fin, said second contact having a second bottom surface immediately adjacent to said second portion such that said gate is positioned laterally between said first contact and said second contact.

2. The test structure of claim 1,
   said first contact being independently biasable against said gate to allow a first electrical property measurement to be acquired from said test device, and
   said second contact being independently biasable against said gate to allow a second electrical property measurement to be acquired from said test device, said first electrical property measurement being comparable to said second electrical property measurement for assessment of lateral dielectric breakdown between said gate and said first contact independent of gate dielectric breakdown.

3. The test structure of claim 1, said first contact being separated from said gate by a first distance, said second contact being separated from said gate by a second distance, and said first distance being different from said second distance.

4. The test structure of claim 1, said first portion comprising a pseudo channel region and said second portion comprising a diffusion region, said pseudo channel region having a different dopant profile than said diffusion region.

5. The test structure of claim 1, said semiconductor fin further comprising alternating additional first and second portions and an additional gate adjacent to each additional first portion.

6. The test structure of claim 1, said first portion having a first height and said second portion having a second height that is greater than said first height.

7. The test structure of claim 1, further comprising duplicate test devices on said insulator layer, said duplicate test devices having a same design as said test device with different size spaces between said gate and said first contact.

8. A test structure comprising:
   an insulator layer; and,
   a test device on said insulator layer, said test device comprising:
      multiple semiconductor fins on said insulator layer, each of said multiple semiconductor fins comprising a first portion at an end of said multiple semiconductor fins and a second portion positioned laterally adjacent to said first portion;

a gate on said first portion of each of said multiple semiconductor fins at said end;

a sidewall spacer on said gate and further positioned laterally immediately adjacent to each of said multiple semiconductor fins at said end such that said semiconductor fins do not extend laterally beyond said sidewall spacer;

a first contact to said insulator layer, said first contact having a first bottom surface immediately adjacent said insulator layer and said first contact being positioned laterally adjacent to said end of said multiple semiconductor fins such that said sidewall spacer is positioned laterally between said gate and said first contact; and, a second contact to said second portion of each of said multiple semiconductor fins, said second contact having a second bottom surface immediately adjacent to said second portion of each of said multiple semiconductor fins such that said gate is positioned laterally between said first contact and said second contact.

9. The test structure of claim 8, said first contact being independently biasable against said gate to allow a first electrical property measurement to be acquired from said test device, and said second contact being independently biasable against said gate to allow a second electrical property measurement to be acquired from said test device, said first electrical property measurement being comparable to said second electrical property measurement for assessment of lateral dielectric breakdown between said gate and said first contact independent of gate dielectric breakdown.

10. The test structure of claim 8, said first contact being separated from said gate by a first distance, said second contact being separated from said gate by a second distance, and said first distance being different from said second distance.

11. The test structure of claim 8, said first portion comprising a pseudo channel region and said second portion comprising a diffusion region, said pseudo channel region having a different dopant profile than said diffusion region.

12. The test structure of claim 8, said multiple semiconductor fins each further comprising alternating additional first and second portions and said test structure further comprising an additional gate adjacent to an additional first portion of each of said multiple semiconductor fins.

13. The test structure of claim 8, further comprising duplicate test devices on said insulator layer, said duplicate test devices having a same design as said test device with different size spaces between said gate and said first contact.

14. A test method comprising:

providing a test structure comprising a test device corresponding to a non-planar semiconductor device structure, said test device being on an insulator layer and comprising:

a semiconductor fin on said insulator layer, said semiconductor fin comprising a top a semiconductor fin on said insulator layer, said semiconductor fin comprising a first portion at one end and a second portion positioned laterally adjacent to said first portion;

a gate adjacent to said first portion at said end;

a sidewall spacer on said gate;

a first contact on said insulator layer adjacent to said end such that said sidewall spacer is positioned laterally between said gate and said first contact; and, a second contact on said second portion such that said gate is positioned laterally between said first contact and said second contact; and, testing said test device, said testing comprising:

independently biasing said first contact against said gate and, during said independently biasing of said first contact against said gate, acquiring a first electrical property measurement from said test device;

independently biasing said second contact against said gate and, during said independently biasing of said second contact against said gate, acquiring a second electrical property measurement from said test device; and, comparing said first electrical property measurement to said second electrical property measurement in order to assess lateral dielectric breakdown between said gate and said first contact independent of gate dielectric breakdown.

15. The test method of claim 14, said first electrical property measurement comprising a first breakdown voltage and said second electrical property measurement comprising a second breakdown voltage.

16. The test method of claim 14, said first electrical property measurement comprising a first time-to-breakdown at a constant voltage and said second electrical property measurement comprising a second time-to-breakdown at said constant voltage.

17. The test method of claim 14, said first electrical property measurement comprising a first leakage current and said second electrical property measurement comprising a second leakage current.

18. The test method of claim 14, said first contact being separated from said gate by a first distance, said second contact being separated from said gate by a second distance, and said first distance being different from said second distance.

19. The test method of claim 14, said first portion comprising a pseudo channel region and said second portion comprising a diffusion region, said pseudo channel region having a different dopant profile than said diffusion region.

20. The test method of claim 14, said test structure further comprising duplicate test devices on said insulator layer, said duplicate test devices having a same design as said test device with different size spaces between said gate and said first contact, and said method further comprising repeating said testing for each of said duplicate test devices and compiling results of said testing of said test device and said repeating of said testing for each of said duplicate test devices in order to predict reliability of said non-planar semiconductor device structure.

* * * * *